(12) United States Patent
Jeon et al.

(10) Patent No.: US 7,369,111 B2
(45) Date of Patent: May 6, 2008

(54) GATE DRIVING CIRCUIT AND DISPLAY APPARATUS HAVING THE SAME

(75) Inventors: Jin Jeon, Suwon-si (KR); Hyung Guel Kim, Yongin-si (KR); Dong Hwan Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 551 days.

(21) Appl. No.: 10/832,631

(22) Filed: Apr. 27, 2004

(65) Prior Publication Data

US 2004/0217935 A1    Nov. 4, 2004

(30) Foreign Application Priority Data

Apr. 29, 2003  (KR) .................... 10-2003-0027087
Nov. 18, 2003  (KR) .................... 10-2003-0081525

(51) Int. Cl.
*G09G 3/36* (2006.01)
(52) U.S. Cl. ................... 345/100; 345/87; 345/98; 377/64
(58) Field of Classification Search ............ 345/55, 345/84, 87, 98, 100; 377/64
See application file for complete search history.

(56) References Cited

U.S. PATENT DOCUMENTS

| | | | | |
|---|---|---|---|---|
| 4,822,142 A * | 4/1989 | Yasui | .................... | 349/48 |
| 5,517,542 A * | 5/1996 | Huq | .................... | 377/78 |
| 6,300,928 B1 * | 10/2001 | Kim | .................... | 345/92 |
| 6,690,347 B2 * | 2/2004 | Jeon et al. | .................. | 345/100 |
| 6,956,423 B2 * | 10/2005 | Neff | .......................... | 327/291 |
| 7,023,410 B2 * | 4/2006 | Lee et al. | .................. | 345/87 |
| 2003/0043104 A1 * | 3/2003 | Lee et al. | .................. | 345/92 |
| 2003/0085885 A1 * | 5/2003 | Nakayoshi et al. | ......... | 345/205 |
| 2004/0189585 A1 * | 9/2004 | Moon | ........................ | 345/100 |

* cited by examiner

*Primary Examiner*—My-Chau T. Tran
(74) *Attorney, Agent, or Firm*—Cantor Colburn LLP

(57) ABSTRACT

A liquid crystal display apparatus including a gate driving circuit disposed on a liquid crystal display is provided. The apparatus further includes a data driving chip, disposed on the liquid crystal display panel, to apply data driving signals to data lines. The gate driving circuit includes a plurality of stages connected to one another in parallel. The odd-numbered stages of the stages each apply gate driving signals to odd-numbered gate lines of the gate lines, in response to a first clock signal and the even-numbered stages of the stages each apply the gate driving signals to even-numbered gate lines of the gate lines, in response to a second clock signal having an opposite phase from a phase of the first clock signal.

33 Claims, 12 Drawing Sheets

350

GATE DRIVING CIRCUIT AND DISPLAY APPARATUS HAVING THE SAME

BACKGROUND OF THE INVENTION

1. Field of the Invention

The present invention relates to a gate driving circuit and a display apparatus, more particularly to a liquid crystal display apparatus including a gate driving circuit integrated into a liquid crystal display panel.

2. Description of the Related Art

Liquid crystal display (LCD) apparatuses include an LCD panel having a liquid crystal layer interposed between two substrates. LCD panels include a display area and peripheral areas surrounding the display area. The display area includes a plurality of gate lines, a plurality of data lines arranged in a direction perpendicular to that of the gate lines and a plurality of thin film transistors (TFTs) connected between the gate lines and the data lines. The peripheral areas include a gate driving circuit for sequentially outputting gate driving signals to the gate lines and a data driving circuit for outputting data signals to the data lines.

In large LCD apparatuses, the gate driving signals applied to gate lines may be delayed due to the longer gate lines and the greater number of TFTs. The gate driving signals may be further delayed because the gate driving signals are provided to adjacent stages included in the gate driving circuit. Thus, the operational properties of the gate driving circuit may be deteriorated. Further, the gate driving circuit is arranged in parallel with the data driving circuit integrated into the peripheral areas of the LCD panel such that the LCD apparatus has a symmetric structure. In this case, the Black Matrix (BM) width of the LCD apparatus is increased. Thus, a need exists for an LCD apparatus capable of improving the operational properties of the gate driving circuit and of reducing the BM width.

BRIEF SUMMARY OF THE INVENTION

The present invention provides a gate driving circuit having improved operational properties.

The present invention further provides a liquid crystal display apparatus in which a single chip is integrated into a liquid crystal panel.

The present invention further provides an organic electro-luminescent display apparatus.

The present invention provides a liquid crystal display apparatus with dual display screen.

According to one aspect of the present invention, a gate driving device for applying gate driving signals to gate lines of a liquid crystal display panel, comprises a plurality of stages connected to one another in parallel to apply gate driving signals to gate lines of a liquid crystal display panel, wherein odd-numbered stages of the stages each output the gate driving signals to odd-numbered gate lines of the gate lines in response to a first clock signal, and even-numbered stages of the stages each output the gate driving signals to even-numbered gate lines of the gate lines in response to a second clock signal, the second clock having an opposite phase from a phase of the first clock signal.

According to another aspect of the present invention, a liquid crystal display apparatus, comprises a liquid crystal display panel including a plurality of pixels, the pixels having a plurality of gate lines, a plurality of data lines and a plurality of switching elements connected between the gate lines and the data lines; a gate driving circuit disposed on the liquid crystal display panel and including a plurality of stages connected to one another in parallel, wherein odd-numbered stages of the stages each apply gate driving signals to odd-numbered gate lines of the gate lines, in response to a first clock signal; and even-numbered stages of the stages each apply the gate driving signals to even-numbered gate lines of the gate lines, in response to a second clock signal having an opposite phase from a phase of the first clock signal; and a data driving chip, disposed on the liquid crystal display panel, to apply data driving signals to the data lines.

According to another aspect of the present invention, an organic electro-luminescent display apparatus, comprises an organic electro-luminescent display panel including a plurality of pixels, the pixels having a plurality of data lines, a plurality of gate lines and a plurality of organic electro-luminescent devices connected to the gate and data lines; a gate driving circuit disposed on the organic electro-luminescent display panel and including a plurality of stages connected to one another in parallel, wherein odd-numbered stages of the stages each apply gate driving signals to odd-numbered gate lines of the gate lines, in response to a first clock signal; and even-numbered stages of the stages each apply the gate driving signals to even-numbered gate lines of the gate lines, in response to a second clock signal having an opposite phase from a phase of the first clock signal; and a data driving chip, disposed on the organic electro-luminescent display panel, to apply data driving signal to the data lines.

According to another aspect of the present invention, a liquid crystal display apparatus, comprises: a liquid crystal display panel including a plurality of gate lines and a plurality of data lines; a first gate driving circuit including a plurality of first stages connected to one another in parallel and disposed on the liquid crystal display panel, the first stages outputting first gate driving signals to odd-numbered gate lines of the gate lines with a blank period; a second gate driving circuit including a plurality of second stages connected to one another in parallel and disposed on the liquid crystal display panel, the second stages outputting second gate driving signals to even-numbered gate lines of the gate lines during the blank period; and a data driving chip, disposed on the liquid crystal display panel, to output data driving signals to the data lines.

According to another aspect of the present invention, a liquid crystal display apparatus comprises: a liquid crystal display panel including a plurality of gate lines and a plurality of data lines; a first gate driving circuit including a plurality of first stages connected to one another in parallel and disposed on the liquid crystal display panel, the first stages outputting first gate driving signals having a first dummy period and a first active period following the first dummy period to odd-numbered gate lines of the gate lines; a second gate driving circuit including a plurality of second stages connected to one another in parallel and disposed on the liquid crystal display panel, the second stages outputting second gate driving signals having a second dummy period and a second active period following the second dummy period to even-numbered gate lines of the gate lines; and a data driving chip, disposed on the liquid crystal display panel, to output data driving signals to the data lines during the first and second active periods.

According to further aspect of the present invention, a liquid crystal display apparatus comprises: a first liquid crystal display panel including a plurality of first gate lines and a plurality of first data lines; a first gate driving circuit including a plurality of first stages connected to one another in parallel and disposed on the first liquid crystal display panel, the first stages outputting first gate driving signals to odd-numbered gate lines of the first gate lines; a second gate driving circuit including a plurality of second stages connected to one another in parallel and disposed on the first liquid crystal display panel, the second stages outputting second gate driving signals to even-numbered gate lines of the first gate lines; a second liquid crystal display panel including a plurality of second gate lines and a plurality of second data lines; a third gate driving circuit including a plurality of third stages connected to one another in parallel and disposed on the second liquid crystal display panel, the third stages outputting third gate driving signals to the third gate lines; a data driving chip, disposed on the first liquid crystal display panel, to output first and second data signals to the first and second data lines and to output first to third gate control signals to the first to third gate driving circuits, wherein the second data signals are transmitted to the second data lines through the first data lines; and a first flexible printed circuit board, disposed between the first liquid crystal display panel and the second liquid crystal display panel, to electrically connect the first data lines of the first liquid crystal display panel and the second data lines of the second liquid crystal display panel.

According to still further aspect of the present invention, a liquid crystal display apparatus, comprises: a main liquid crystal display panel including a plurality of main gate lines and a plurality of main data lines; a main gate driving circuit including a plurality of main stages connected to one another in parallel and disposed on the main liquid crystal display panel, the main stages outputting main gate driving signals to the main gate lines; a sub liquid crystal display panel including a plurality of sub gate lines and a plurality of sub data lines; a sub gate driving circuit including a plurality of sub stages connected to one another in parallel and disposed on the sub liquid crystal display panel, the sub stages outputting sub gate driving signals to the sub gate lines; a data driving chip, disposed on the main liquid crystal display panel, to output main and sub data signals to the main and sub data lines and to output main gate control signals to the main gate driving circuits, wherein the sub data signals are transmitted to the sub data lines through the main data lines; and a flexible printed circuit board, disposed between the main liquid crystal display panel and the sub liquid crystal display panel, to electrically connect the main data lines of the main liquid crystal display panel and the sub data lines of the sub liquid crystal display panel.

This application claims upon the priorities of Korean Patent Application No. 2003-81525 filed on Nov. 18, 2003 and Korean Patent Application No. 2003-27087 filed on Apr. 29, 2003, the contents of which are herein incorporated by reference in its entirety.

BRIEF DESCRIPTION OF THE DRAWINGS

The above and other advantages of the present invention will become readily apparent by reference to the following detailed description when considered in conjunction with the accompanying drawings wherein.

DETAILED DESCRIPTION OF THE INVENTION

Figure 1:
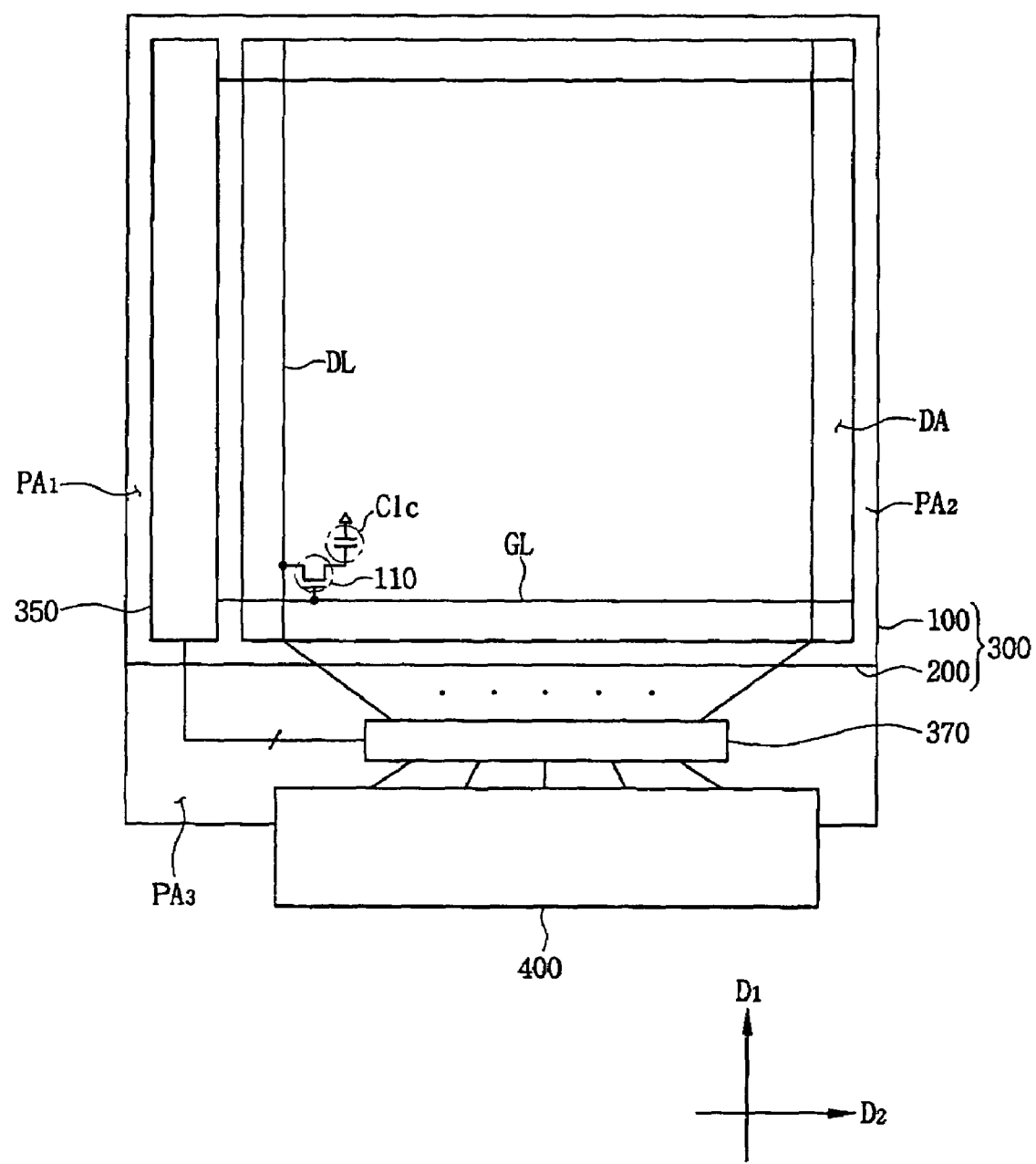
FIG. 1 is a schematic plan view showing an LCD apparatus according to an exemplary embodiment of the present invention.

FIG. 1 is a schematic plan view showing an LCD apparatus according to an exemplary embodiment of the present invention. An LCD apparatus 500 includes an LCD panel 300, a gate driving circuit 350, a data driving chip 370 and a Flexible Printed Circuit Board (FPC) 400. The LCD panel 300 includes a first substrate 100, a second substrate 200 facing the first substrate 100 and a liquid crystal layer (not shown) interposed between the first and second substrates 100 and 200.

The LCD panel 300 includes a display area DA to display an image and first to third peripheral areas $PA_1$-$PA_3$ adjacent to the display area DA. The display area DA includes pixel matrix having a plurality of gate line $GL_n$ arranged in a first direction $D_1$, a plurality of data line $DL_m$ arranged in a second direction $D_2$ substantially perpendicular to the first direction $D_1$ and insulated from the gate line $GL_n$, and a plurality of thin film transistors (TFT) 110 connected between the gate lines $GL_n$ and data lines $DL_m$. In the exemplary embodiment, "n" and "m" are an integer identical to or greater than one. Each TFT 110 includes a gate electrode connected to each gate line GL, a source electrode (a first current electrode) connected to each data line DL and a drain electrode (or a second current electrode) connected to a liquid crystal capacitor Clc.

The gate driving circuit 350 is disposed on the first peripheral area PA, and outputs gate driving signals to the gate lines $GL_n$. The data driving chip 370 is mounted onto the third peripheral area $PA_3$ and outputs a data signal to the data lines $DL_m$. The FPC 400 is further mounted on the third peripheral area $PA_3$, in order to connect an external device (not shown) for driving the LCD panel 300 to the data driving chip 370. The FPC 400 provides a data signal, a data control signal and a gate control signal with the data driving chip 370. The data driving chip 370 outputs the data signal to the data lines $DL_m$ as well as provides the gate control signals to the gate driving circuit 350. In response to the gate control signal, the gate driving circuit 350 outputs the gate driving signals to the gate lines $GL_n$.

Figure 2:
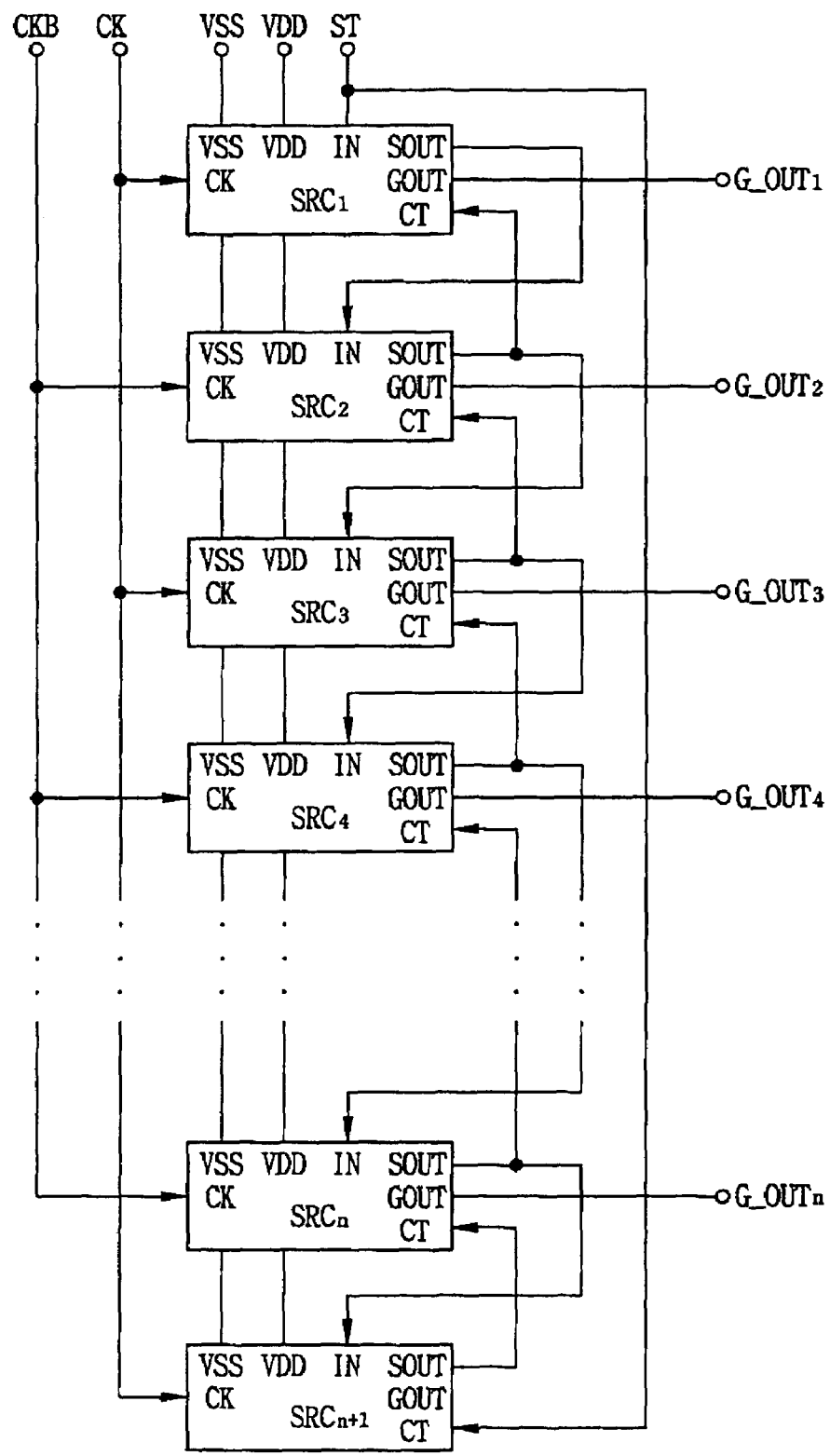
FIG. 2 is a circuit diagram of the gate driving circuit shown in FIG. 1.

FIG. 2 is a circuit diagram showing the gate driving circuit shown in FIG. 1. The gate driving circuit 350 includes a shift register having a plurality of stages $SRC_1$-

$SRC_{n+1}$ connected to one other in parallel. The stages include an N number of driving stages $SRC_1$-$SRC_n$ and one dummy stage $SRC_{n+1}$. Each of the stages $SRC_1$ to $SRC_{n+1}$ includes a clock signal terminal CK, a first output terminal GOUT, a second output terminal SOUT, an input terminal IN and a control terminal CT. In this case, N in an integer identical to or greater than one.

First and second clock signals CK and CKB, having an opposite phase to each other, are alternatively applied to the clock signal terminals CK of the stages. For example, the first clock signal CK is applied to the odd-numbered stages $SRC_1$, $SRC_3$, ..., $SRC_{n+1}$ of the stages. The second clock signal CKB is applied to the even-numbered stages $SRC_2$, $SRC_4$, ..., $SRC_n$ of the stages. In response to the first or second clock signal CK or CKB, the first output terminal GOUT outputs the first or second clock signal CK or CKB as a gate driving signal, which is applied to a corresponding one of the gate lines $GL_n$, and the second output terminal SOUT outputs the first or second clock signal CK or CKB as a stage driving signal.

The input terminal IN receives the stage driving signal output from the second output terminal SOUT of a previous stage, and the control terminal CT receives the stage driving signal output from the second output terminal SOUT of a next stage. The input terminal IN of the first driving stage $SRC_1$ receives a start signal ST because there is no previous stage with respect to the first driving stage $SRC_1$. Also, the control terminal CT of the dummy stage $SRC_{n+1}$ receives the start signal ST because there is no next stage with respect to the dummy stage $SRC_{n+1}$. Each of the stages $SRC_1$ to $SRC_{n+1}$ further includes a ground voltage terminal VSS and a driving voltage terminal VDD that receive a ground voltage and a driving voltage, respectively.

Figure 3:
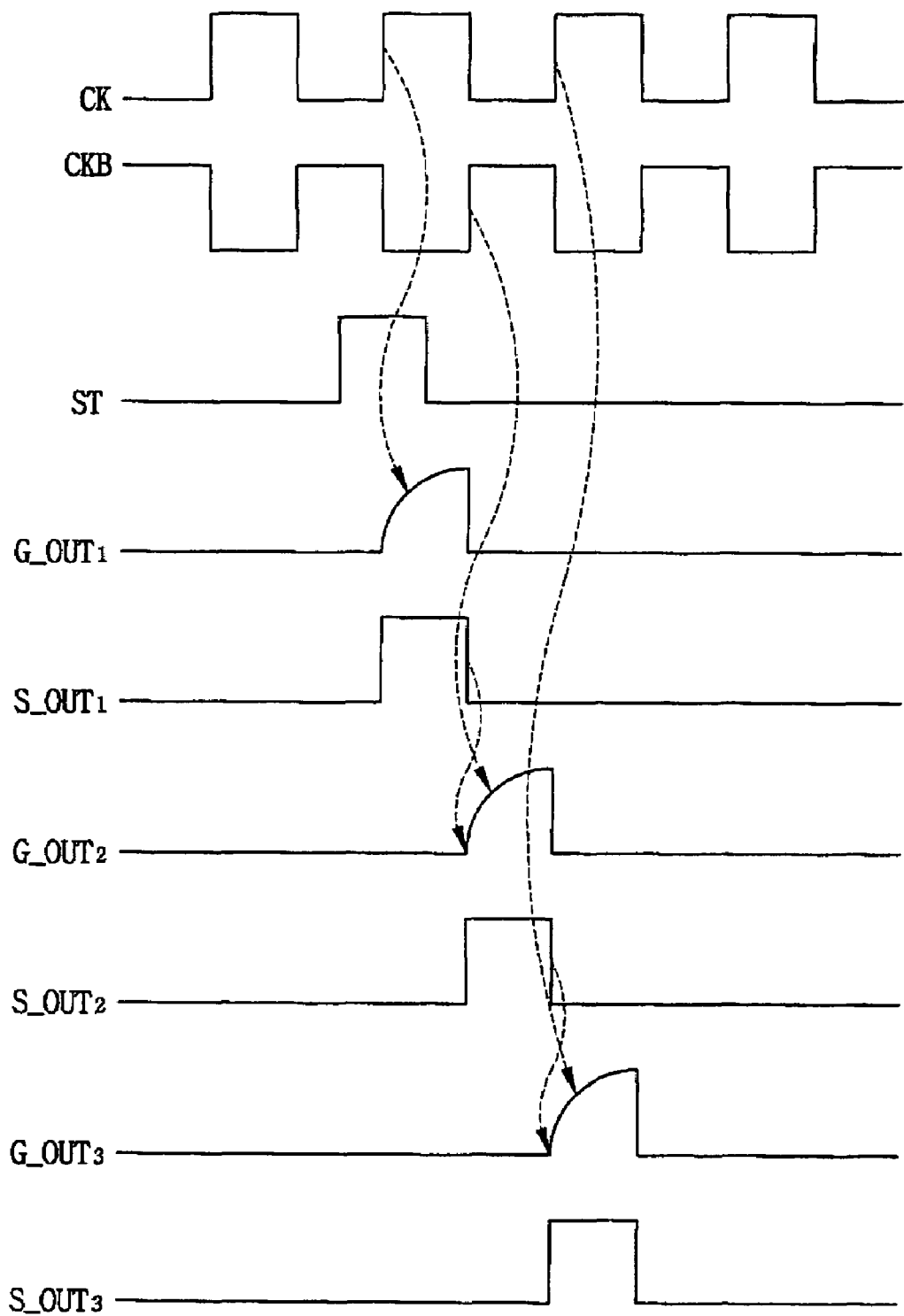
FIG. 3 is a timing diagram of the gate driving circuit shown in FIG. 2.

FIG. 3 is a timing diagram of the gate driving circuit of FIG. 2. The first and second clock signals CK and CKB have the opposite phase to each other, for example, a high state or a low state. The first driving stage $SRC_1$ is activated in response to the high state of the start signal ST, and outputs a first gate driving signal $G\_OUT_1$ of a high state through the first output terminal GOUT. Since a first gate line $GL_1$ connected to the first output terminal GOUT, and the TFT 110 and liquid crystal capacitor Clc connected to the first gate line $GL_1$ operate as a load, the first gate driving signal $G\_OUT_1$ is delayed.

The first driving stage $SRC_1$ outputs a first stage driving signal $S\_OUT_1$ of a high state through the second output terminal SOUT. The first stage driving signal $S\_OUT_1$ is outputted without delay because the load of the second output terminal SOUT of the first driving stage $SRC_1$ is relatively small. The first stage driving signal $S\_OUT_1$ is provided to the input terminal IN of a second driving stage $SRC_2$, so that the second driving stage $SRC_2$ is operated regardless of the delay of the first gate driving signal $G\_OUT_1$.

The second driving stage $SRC_2$ outputs a second gate driving signal $G\_OUT_2$ of a high state and a second stage driving signal $S\_OUT_2$ of a high stage through a first output terminal GOUT and a second output terminal SOUT thereof, respectively. The second stage driving signal $S\_OUT_2$ is provided to the control terminal CT of the first driving stage $SRC_1$ and to the input terminal IN of a third driving stage $SRC_3$. Therefore, the first gate driving signal $G\_OUT_1$ and the first stage driving signal $S\_OUT_1$ respectively output from the first and second output terminals GOUT and SOUT of the first driving stage $SRC_1$ are transitioned into a low state in response to the second stage driving signal $S\_OUT_2$.

The third driving stage $SRC_3$ outputs a third gate driving signal $G\_OUT_3$ and a third stage driving signal $S\_OUT_3$ having a high stage through first and second output terminals GOUT and SOUT, respectively, while the second gate driving signal $G\_OUT_2$ and second stage driving signal $S\_OUT_2$ output from the first and second output terminals GOUT and SOUT of the second driving stage $SRC_2$ transition from a high stage to a low state. By repeatedly performing the foregoing operations, the gate driving signal in a high state is sequentially output from the driving stages $SRC_1$ to $SRC\_O_n$.

Figure 4:
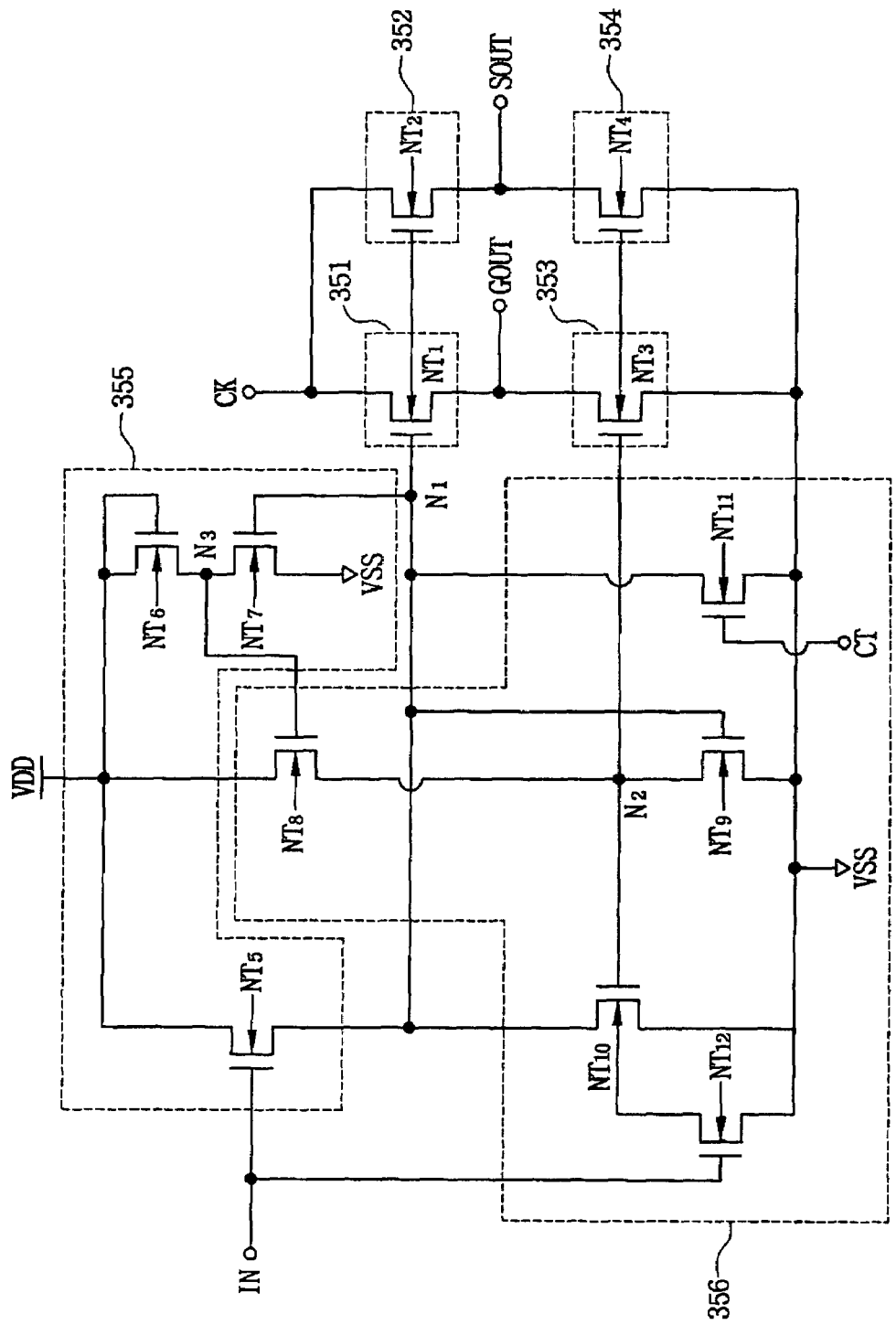
FIG. 4 is a circuit diagram of each stage of the gate driving circuit shown in FIG. 2.

FIG. 4 is a circuit diagram showing each stage of FIG. 2. Each stage of the stages of the gate driving circuit 350 includes a first pull-up part 351, a second pull-up part 352, a first pull-down part 353, a second pull-down part 354, a pull-up driving part 355 and a pull-down driving part 356.

The first pull-up part 351 transmits the first clock signal CK or the second clock signal CKB from the clock signal terminal CK to the first output terminal GOUT. The second pull-up part 352 transmits the first clock signal CK or the second clock signal CKB from the clock signal terminal CK to the second output terminal SOUT.

The first pull-up part 351 includes a first NMOS transistor NT1 having a gate electrode connected to a first node N1, a source electrode connected to the clock signal terminal CK and a drain electrode connected to the first output terminal GOUT. The second pull-up part 352 includes a second NMOS transistor NT2 having a gate electrode connected to the gate electrode of the first NMOS transistor NT1, a source electrode connected to the clock signal terminal CK and a drain electrode connected to the second output terminal SOUT. The first and second NMOS transistors NT1 and NT2 each have a channel length of about 3.5 micrometers. The first NMOS transistor NT1 has a channel width of about 1110 micrometers and the second NMOS transistor NT2 has a channel width of about 100 micrometers. The channel width ratio of the first NMOS transistor NT1 to the second NMOS transistor NT2 is approximately 10:1.

The first pull-down part 353 is activated in response to the inactivation of the first pull-up part 351, and discharges the first clock signal CK or second clock signal CKB output from the first output terminal GOUT. The second pull-down part 354 is activated in response to the inactivation of the second pull-up part 352, and discharges the first clock signal CK or second clock signal CKB output from the second output terminal SOUT.

The first pull-down part 353 includes a third NMOS transistor NT3 having a gate electrode connected to a second node N2, a drain electrode connected to the first output terminal GOUT and a source electrode connected to the ground voltage terminal VSS. The second pull-down part 354 includes a fourth NMOS transistor NT4 having a gate electrode connected to the gate electrode of the third NMOS transistor NT3, a drain electrode connected to the second output terminal SOUT and a source electrode connected to the ground voltage terminal VSS. The third and fourth NMOS transistors NT3 and NT4 each have a channel length of about 3.5 micrometers. The third NMOS transistor NT3 has a channel width of about 2035 micrometers and the fourth NMOS transistor NT4 has a channel width of about 100 micrometers, so that a channel width ratio of the third NMOS transistor T3 to the fourth NMOS transistor T4 is approximately 20:1.

The pull-up driving part 355 includes fifth, sixth and seventh NMOS transistors NT5, NT6 and NT7 and activates the first and second pull-up parts 351 and 352. The fifth NMOS transistor NT5 includes a gate electrode connected to the input terminal IN, a drain electrode connected to the driving voltage terminal VDD and a source electrode connected to the first node N1. The sixth NMOS transistor NT6 includes gate and drain electrodes commonly connected to the driving voltage terminal VDD, and a source electrode connected to the third node N3. The seventh NMOS transistor NT7 includes a gate electrode connected to the first node N1, a drain electrode connected to the third node N3 and a source electrode connected to the ground voltage terminal VSS. The fifth, sixth and seventh NMOS transistors NT5, NT6 and NT7 each have a channel length of about 3.5 micrometers. The fifth NMOS transistor NT5 has a channel width of about 300 micrometers, and the sixth and seventh NMOS transistors NT6 and NT7 each have a channel width of about 50 micrometers.

The pull-down driving part 356 includes eighth, ninth, tenth and eleventh NMOS transistors NT8, NT9, NT10 and NT11 and inactivates the first and second pull-up parts 351 and 352. Further, the pull-down driving part 356 activates the first and second pull-down part 353 and 354.

The eighth NMOS transistor NT8 includes a gate electrode connected to a third node N3, a drain electrode connected to the driving voltage terminal VDD and a source electrode connected to the second node N2. The ninth NMOS transistor NT9 includes a gate electrode connected to the first node N1, a drain electrode connected to the second node N2 and a source electrode connected to the ground voltage terminal VSS. The tenth NMOS transistor NT10 includes a gate electrode connected to the second node N2, a drain electrode connected to the first node N1 and a source electrode connected to the ground voltage terminal VSS. The eleventh NMOS transistor NT11 includes a gate electrode connected to the control terminal CT, a drain electrode connected to the first node N1 and a source electrode connected to the ground voltage terminal VSS.

The pull-down driving part 356 further includes a twelfth NMOS transistor NT12 includes a gate electrode connected to the input terminal IN, a drain electrode connected to the second node N2 and a source electrode connected to the ground voltage terminal VSS. The eighth, ninth, tenth, eleventh and twelfth NMOS transistors NT8, NT9, NT10, NT11 and NT12 have a channel length of about 3.5 micrometers. The eight and twelfth NMOS transistors NT8 and NT12 have a channel width of about 100 micrometers. The ninth, ten and eleventh NMOS transistors NT9, NT10 and NT11 have a channel width of about 150 micrometers, about 100 micrometers and about 150 micrometers, respectively.

When the input terminal IN receives a stage driving signal from the second output terminal SOUT of a previous stage, the fifth NMOS transistor NT5 is activated to raise an electric potential at the first node N1. In response to the electric potential of a high level at the first node N1, the first and second NMOS transistors NT1 and NT2 are activated to output the gate driving signal and the stage driving signal via the first output terminal GOUT and the second output terminal SOUT, respectively. Further, the seventh NMOS transistor NT7 is activated in response to the electric potential of a high level at the first Node N1. Since the seventh NMOS transistor NT7 is activated and the sixth NMOS transistor NT6 maintains an activation state, an electric potential falls down at the third node N3.

In response to the electric potential of a low level at the third note N3, the eighth NMOS transistor T8 is inactivated, and thus, the second node N2 does not receive the driving voltage VDD. The ninth NMOS transistor NT9 is activated in response to the electric potential of a high level at the first node N1 so that the electric potential at the second node N2 is maintained in the ground voltage VSS. In response to the electric potential of the second node N2 of a low level, the third and fourth NMOS transistors NT3 and NT4 are inactivated.

When the control terminal CT receives the stage driving signal from the second output terminal SOUT of a next stage, the eleventh NMOS transistor T11 is activated to discharge the electric potential at the first node N1 to the ground voltage VSS. In response to the electric potential of a low level at the first note N1, the seventh and ninth NMOS transistors NT7 and NT9 are inactivated. Thus, the electric potential at the second node N2 is gradually raised in response to the activation of the eighth NMOS transistor NT8, and the third and fourth NMOS transistors NT3 and NT4 are activated to discharge the gate driving signal output from the first and second output terminals GOUT and SOUT to the ground voltage VSS. In response to the electric potential of a high level at the second node N2, the twelfth and tenth NMOS transistors NT12 and NT10 are activated so that the electric potential at the first node N1 is discharged rapidly. Thus, each stage may output the gate and stage driving signals, which maintain a high state during a predetermined period.

Figure 5:
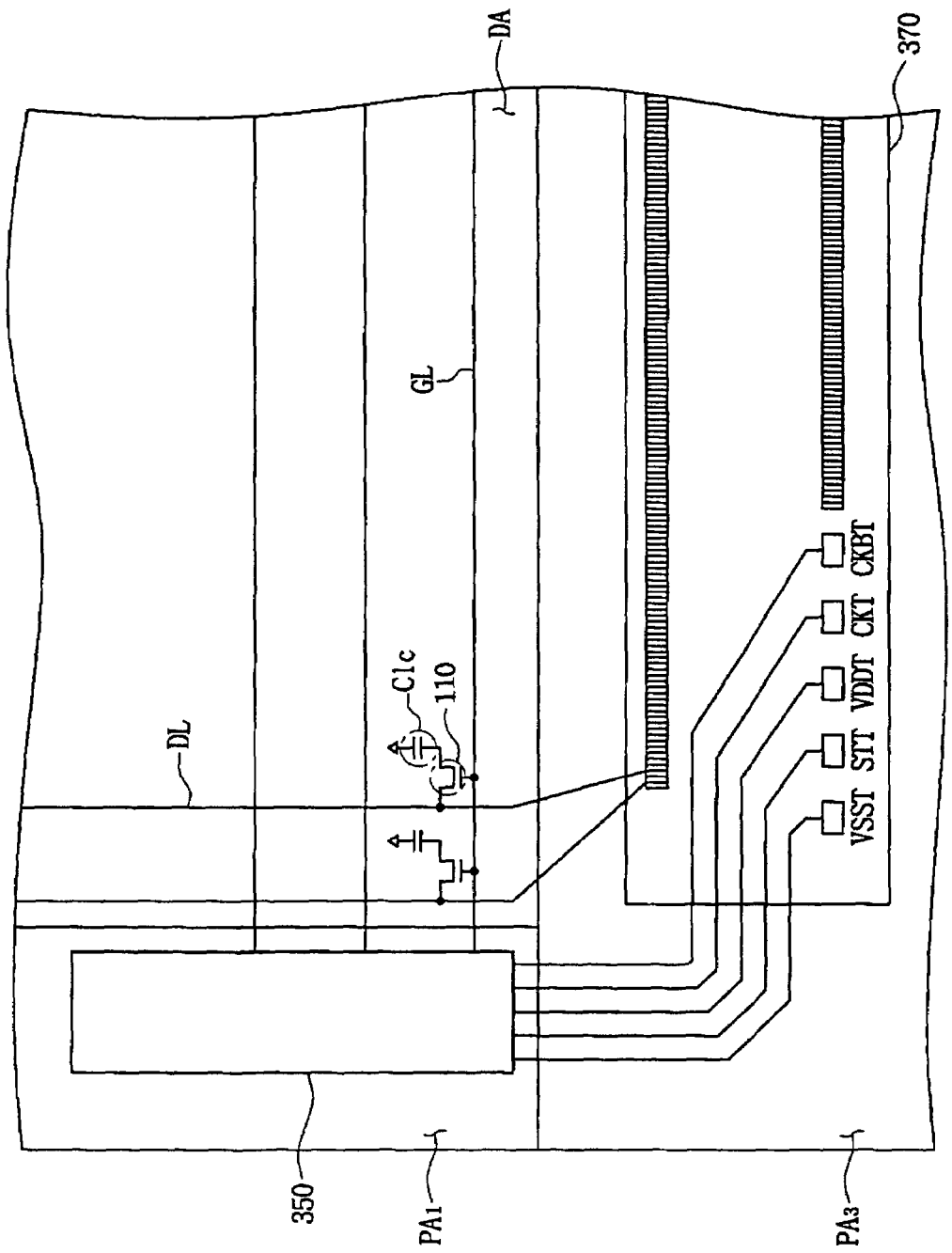
FIG. 5 is a schematic plan view showing the data driving chip connected to the gate driving circuit shown in FIG. 1.

FIG. 5 is a diagram showing the data driving chip 370 connected to the gate driving circuit 350. The data driving chip 370 includes a start signal input terminal STT to receive a start signal ST, a first clock signal input terminal CKT to receive a first clock signal CK, a second clock signal input terminal CKBT to receive a second clock signal CKB, a ground voltage input terminal VSST to receive a ground voltage VSS and a driving voltage input terminal VDDT to receive a driving voltage VDD.

The start signal input terminal STT is electrically connected to the first driving stage $SRC_1$ and dummy stage $SRC_{n+1}$ of the gate driving circuit 350. The first clock signal input terminal CKT is electrically connected to the clock signal terminal CK of the odd numbered stages $SRC_1$, $SRC_3$, ... $SRC_{n+1}$, and the second clock signal input terminal CKBT is electrically connected to the clock signal terminal CK of the even numbered stages $SRC_2$, $SRC_4$, ... $SRC_n$. The ground voltage input terminal VSST is electrically connected to the ground voltage terminal VSS of the stages $SRC_1$, ... , $SRC_{n+1}$. The driving voltage input terminal VDDT is electrically connected to the driving voltage terminal VDD of the stages $SRC\_O1$, ... , $SRC\_O_{n+1}$. Thus, the data driving chip 370 provides the start signal ST, the first and second clock signals CK and CKB, the ground voltage CSS and the driving voltage VDD with the gate driving circuit 350.

Figure 6:
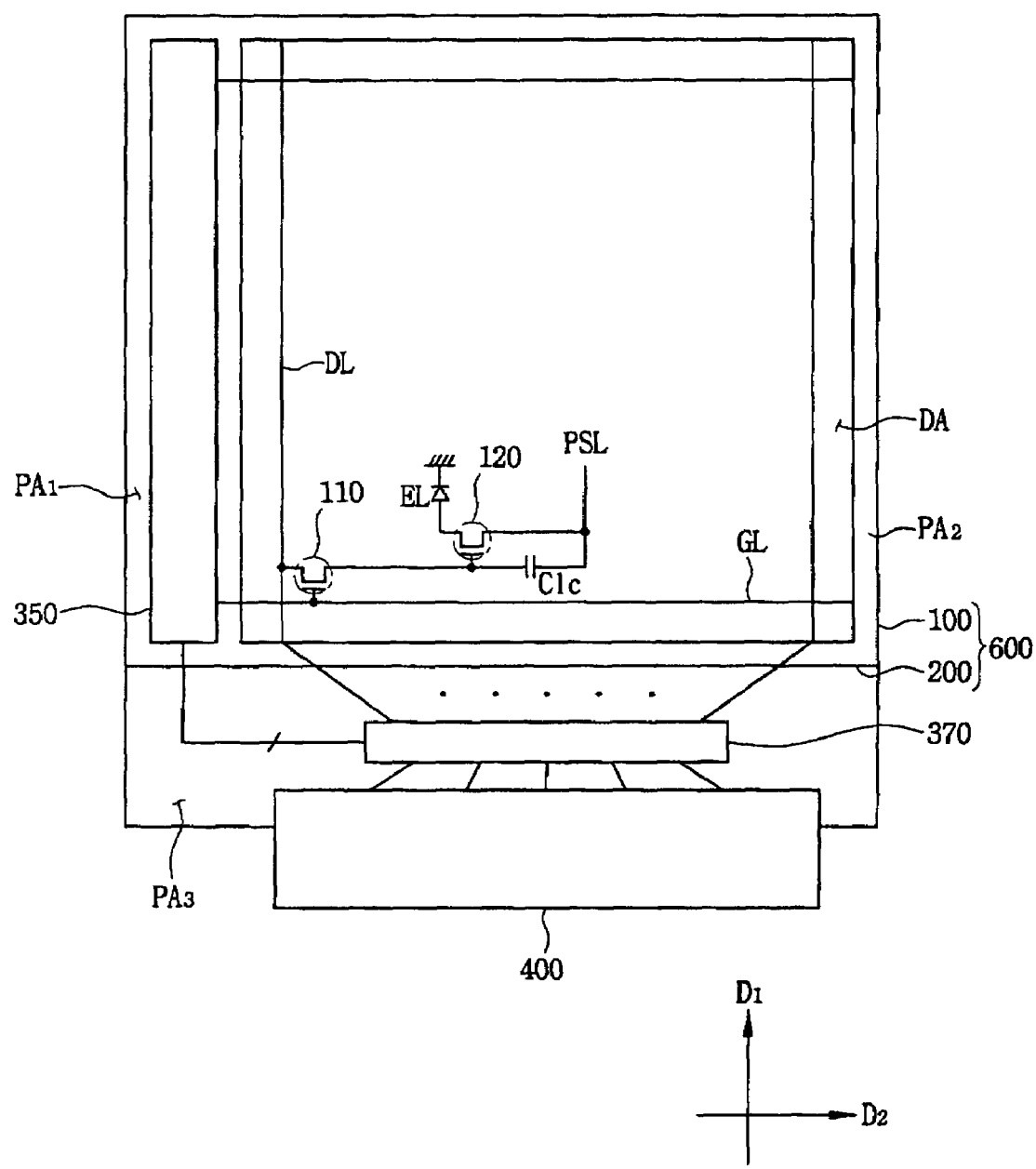
FIG. 6 is a schematic plan view showing an organic electro-luminescent display device according to another exemplary embodiment of the present invention.

FIG. 6 is a schematic plan view showing an organic electro-luminescent display apparatus, according to another exemplary embodiment of the present invention. An organic electro-luminescent (EL) display apparatus 700 includes an organic electro-luminescent display panel 600 having a first substrate 100, a second substrate 200 facing the first substrate 100 and an organic electro-luminescent device (EL) interposed between the first and second substrates 100 and 200.

The organic electro-luminescent display panel 600 includes a display area DA for displaying an image and first and third peripheral areas $PA_1$ to $PA_3$ adjacent to the display area DA. The display area DA includes a plurality of pixels formed in a matrix configuration, an N number of gate lines GLs arranged in a first direction $D_1$ and an M number of data lines DL arranged in a second direction $D_2$ substantially perpendicular to the first direction $D_1$ and insulated from the gate lines GLs. In this exemplary embodiment, "N" and "M" are an integer identical to greater than one.

Each of the pixels is defined by the gate line GL, the data line DL and a power supply line PSL, and includes a switching transistor 110, a driving transistor 120, an organic electro-luminescent device (EL). The switching transistor 110 includes a source electrode connected to the data line DL, a gate electrode connected to the gate line GL and a drain electrode connected to both a liquid crystal capacitor Clc and the gate electrode of the driving transistor 120. The driving transistor 120 includes a source electrode electrically connected to the power supply line PSL, a drain electrode connected to the organic electro-luminescent device (EL) and a gate electrode connected to the drain electrode of the switching transistor 110. The liquid crystal capacitor Clc is electrically connected between the drain electrode of the switching transistor 110 and the source electrode of the driving transistor 120. The organic electro-luminescent device (EL) includes a grounded cathode electrode and an anode electrode connected to the drain electrode of the driving transistor 120 so as to receive the driving current provided from the power supply line PSL. The power supply line PSL receives a direct current signal from an external power supply device (not shown).

A gate driving circuit 350 is disposed onto the first peripheral area $PA_1$ to sequentially output gate driving signals to the gate lines GL. A data driving chip 370 is mounted onto the third peripheral area $PA_3$ to output a data signal to the data lines DL. An external device (not shown) for driving the LCD panel 300 and a Flexible Printed Circuit board (FPC) 400 for electrically connecting the external device to the LCD panel 300 may be further mounted onto the third peripheral area $PA_3$. The FPC 400 is electrically connected to the data driving chip 370 to output a data signal, a data control signal and a gate control signal. Thus, the gate control signal is applied to the gate driving circuit 350 through the data driving chip 370.

The gate driving circuit 350, as described above, includes a plurality of stages. Each stage includes a clock signal terminal to receive a clock signal, a first output terminal to output the clock signal as a gate driving signal, a second output terminal to output the clock signal as a stage driving signal, an input terminal and a control terminal to receive the stage driving signal. Thus, in the gate driving circuit 350, the stage driving signal is provided to the input and control terminals of the adjacent stages without distorting. Thus, the operational properties of the gate driving circuit 350 and the display properties of the display apparatus 700 are improved.

Figure 7:
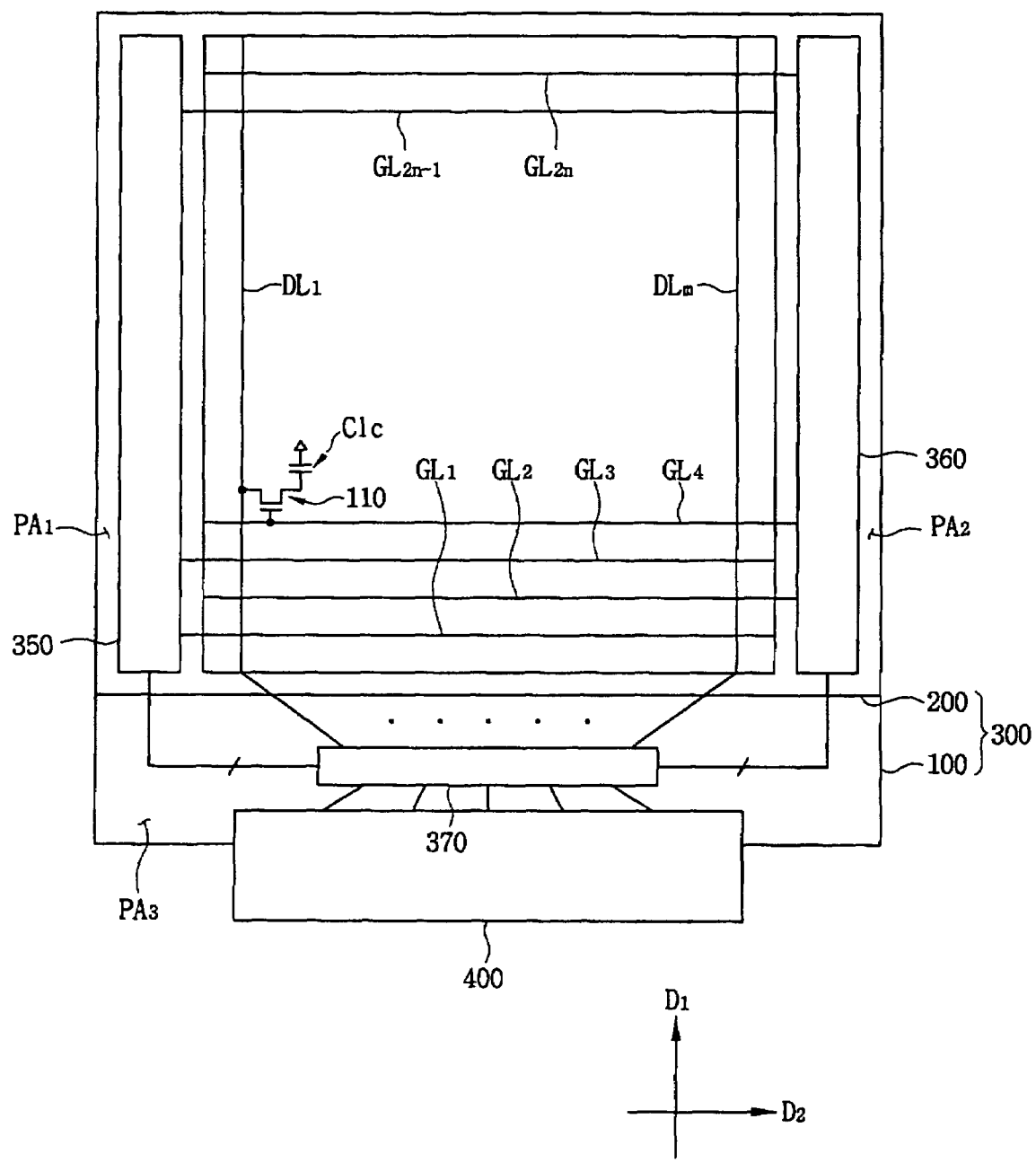
FIG. 7 is a schematic plan view showing an LCD apparatus according to another exemplary embodiment of the present invention.

FIG. 7 is a schematic plan view showing an LCD apparatus according to another exemplary embodiment of the present invention. The same reference numerals are used to refer the same or like parts those described in FIG. 1 and any further explanation is omitted.

An LCD apparatus 800 includes an LCD panel 300, first and second gate driving circuits 350 and 360, a data driving chip 370 and a Flexible Printed Circuit board (FPC) 400. The LCD panel 300 includes a first substrate 100, a second substrate 200 facing the first substrate 100 and a liquid crystal layer (not shown) interposed between the first and second substrates 100 and 200.

The first gate driving circuit 350 is disposed on the first peripheral area PA, and outputs gate driving signals to the odd numbered gate lines of the gate lines $GL_{2n-1}$. The second gate driving circuit 360 is disposed on the second peripheral area $PA_2$, which is opposite the first peripheral area $PA_1$, and outputs the gate driving signals to the even numbered gate lines of the gate lines $GL_{2n}$. The data driving chip 370 is mounted onto the third peripheral area $PA_3$ and outputs a data signal to the data lines $DL_m$. On the third peripheral area $PA_3$, the FPC 400 is further mounted. The FPC 400 electrically connects an external device (not shown) for driving the LCD panel 300 and the data driving chip 370. The data driving chip 370 outputs a data signal and first and second gate control signals to the data lines $DL_m$ and the first and second gate driving circuits 350 and 360 through the FPC 400. Therefore, the first and second gate driving circuits 350 and 360 apply the gate driving signals to the odd numbered and even numbered gate lines of the gate lines, respectively.

Figure 8:
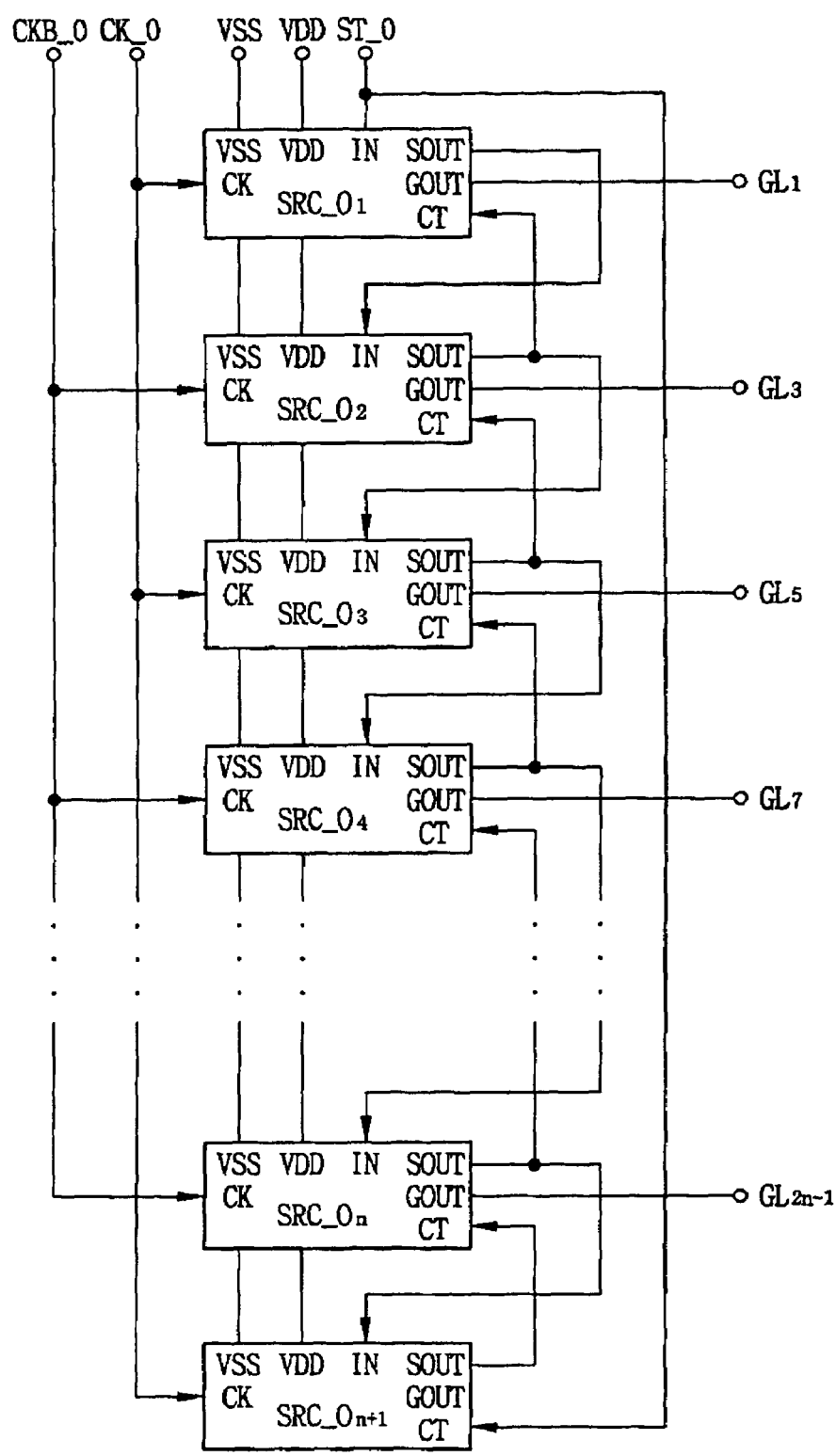
FIG. 8 is a circuit diagram showing the first gate driving circuit shown in FIG. 7.

FIG. 8 is a circuit diagram showing the first gate driving circuit shown in FIG. 7. The first gate driving circuit 350 includes a first shift register having a plurality of odd stages $SRC\_O_1$-$SRC\_O_{n+1}$ connected to one another in parallel. Each odd stage includes the same structure to that of the stage shown in FIG. 4. The odd stages include an N number of driving stages $SRC\_O_1$-$SRC\_O_n$ and one dummy stage $SRC\_O_{n+1}$. Each of the odd stages $SRC\_O_1$ to $SRC\_O_{n+1}$ includes a clock signal terminal CK, a first output terminal GOUT, a second output terminal SOUT, an input terminal IN and a control terminal CT.

First and second clock signals CK_O and CKB_O are alternatively applied to the clock signal terminals CK of the odd stages. For example, the first clock signal CK_O is applied to the odd-numbered stages $SRC\_O_1$, $SRC\_O_3$, . . . , $SRC\_O_{n+1}$ of the odd stages, and the second clock signal CKB_O is applied to the even-numbered stages $SRC\_O_2$, $SRC\_O_4$, . . . $SRC\_O_n$ of the odd stages.

The first clock signal CK_O is outputted as a first gate driving signal through the first output terminal GOUT of the odd-numbered stages $SRC\_O_1$, $SRC\_O_3$, . . . , $SRC\_O_{n-1}$ of the driving stages, and the second clock signal CKB_O is outputted as the first gate driving signal through the first output terminal GOUT of the even-numbered stages $SRC\_O_2$, $SRC\_O_4$, . . . , $SRC\_O_n$ of the driving stages. The first output terminal GOUT of the dummy stage $SRC\_O_{n+1}$ is maintained in a floating state because there is no gate line corresponding to the first output terminal GOUT of the dummy stage $SRC\_O_{n+1}$. The first output terminal GOUT of the odd stages $SRC\_O_1$ to $SRC\_O_n$ is electrically connected to a corresponding one of the odd-numbered gate lines $GL_1$, $GL_3$, . . . , $GL_{2n-1}$ formed at a display area DA. Therefore, the first gate driving signals output from the first output terminals GOUT of the odd stages $SRC\_O_1$ to $SRC\_O_n$ are sequentially applied to the odd-numbered gate lines $GL_1$, $GL_3$, . . . , $GL_{2n-1}$.

The first clock signal CK_O is outputted as a first stage driving signal through the second output terminal SOUT of the odd-numbered stages $SRC\_O_1$, $SRC\_O_3$, . . . , $SRC\_O_{n+1}$ of the odd stages, and the second clock signal CKB_O is outputted as the first stage driving signal through the second output terminal SOUT of the even stages $SRC\_O_2$, $SRC\_O_4$, . . . $SRC\_O_n$. The input terminal IN receives the first stage driving signal output from the second output terminal SOUT of a previous odd stage, and the control terminal CT receives the first stage driving signal output from the second output terminal SOUT of a next odd stage. The input terminal IN of the first driving stage $SRC\_O_1$ receives a first start signal ST because there is no previous odd stage with respect to the first driving stage $SRC\_O_1$. Also, the control terminal CT of the dummy stage $SRC\_O_{n+1}$ receives the first start signal ST because there is no next odd stage with respect to the dummy stage $SRC\_O_{n+1}$. Each of the odd stages $SRC\_O_1$ to $SRC\_O_{n+1}$ further includes a ground voltage terminal VSS and a driving voltage terminal VDD that receive a ground voltage and a driving voltage, respectively.

Figure 9:
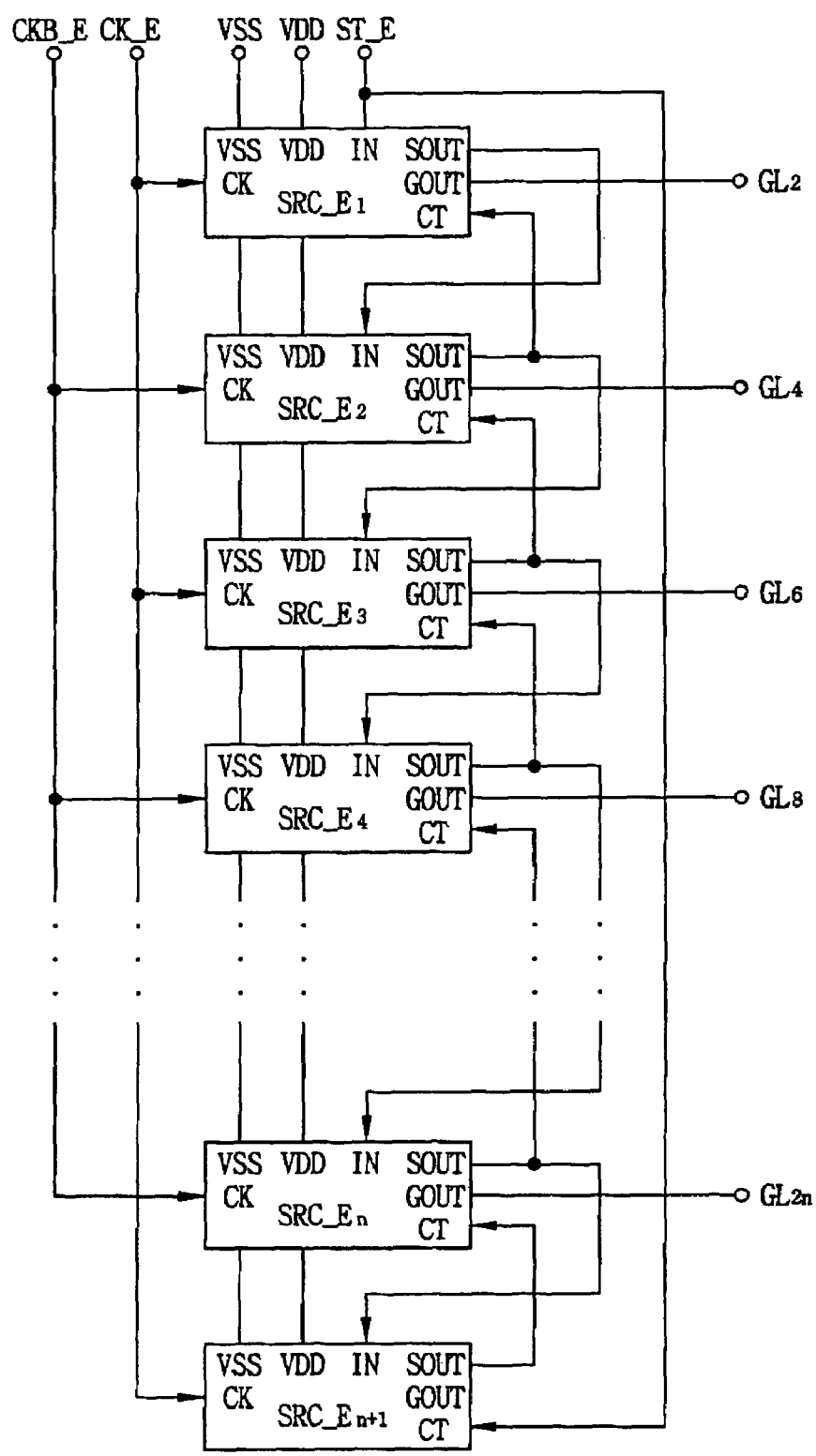
FIG. 9 is a circuit diagram showing the second gate driving circuit shown in FIG. 7.

Referring to FIG. 9, a second gate driving circuit 360 includes a second shift register having a plurality of even stages $SRC\_E_1$ to $SRC\_E_{n+1}$ connected to one another in parallel. The even stages $SRC\_E_1$ to $SRC\_E_{n+1}$ include a plurality of driving stages $SRC\_E_1$ to $SRC\_E_n$ and one dummy stage $SRC\_E_{n+1}$. Each even stage includes the same structure to that of the stage shown in FIG. 4. Each of the even stages $SRC\_E_1$ to $SRC\_E_{n+1}$ includes a clock signal terminal CK, a first output terminal GOUT, a second output terminal SOUT, an input terminal IN and a control terminal CT.

The clock signal terminal CK receives a third clock signal CK_E or a fourth clock signal CKB_E. For example, the clock signal terminal CK at the odd-numbered stages $SRC\_E_1$, $SRC\_E_3$, ..., $SRC\_E_{n+1}$ of the even stages receives the third clock signal CK_E, and the clock signal terminal CK at the even-numbered stages $SRC\_E_2$, $SRC\_E_4$, ..., $SRC\_E_n$ of the even stages receives the fourth clock signal CKB_E.

The third clock signal CK_E is outputted as a second gate driving signal through the first output terminal GOUT of the even-numbered stages $SRC\_E_1$, $SRC\_E_3$, ..., $SRC\_E_{n-1}$ of the driving stages, and the second clock signal CKB_E is outputted as the second gate driving signal through the first output terminal GOUT of the even-numbered stages $SRC\_E_2$, $SRC\_E_4$, ..., $SRC\_E_n$ of the driving stages. The first output terminal GOUT of the even stages $SRC\_E_1$ to $SRC\_E_n$ is electrically connected to a corresponding one of the even-numbered gate lines $GL_2$, $GL_4$, ..., $GL_{2n}$ formed at a display area DA. Therefore, the second gate driving signals output from the first output terminals GOUT of the even stages $SRC\_E_1$ to $SRC\_E_n$ are sequentially applied to the even-numbered gate lines $GL_2$, $GL_4$, ... $GL_{2n}$.

The third clock signal CK_E is outputted as a second stage driving signal through the second output terminal SOUT of the even-numbered stages $SRC\_E_1$, $SRC\_E_3$, ..., $SRC\_E_{n+1}$ of the even stages, and the fourth clock signal CKB_E is outputted as the second stage driving signal through the second output terminal SOUT of the even-numbered stages $SRC\_E_2$, $SRC\_E_4$, ..., $SRC\_E_n$ of the even stages. The second stage driving signal output from the second output terminal SOUT of a previous even stage is inputted to the input terminal IN, and the second stage driving signal output from the second output terminal SOUT of a next even stage is inputted to the control terminal CT. The input terminal IN of the first even stage $SRC\_E_1$ receives a second start signal ST_E because there is no previous even stage with respect to the first even stage $SRC\_E_1$. Also, the control terminal CT of the dummy stage $SRC\_E_{n+1}$ receives the second start signal ST_E since there is no next even stage with respect to the dummy stage $SRC\_E_{n+1}$.

Figure 10:
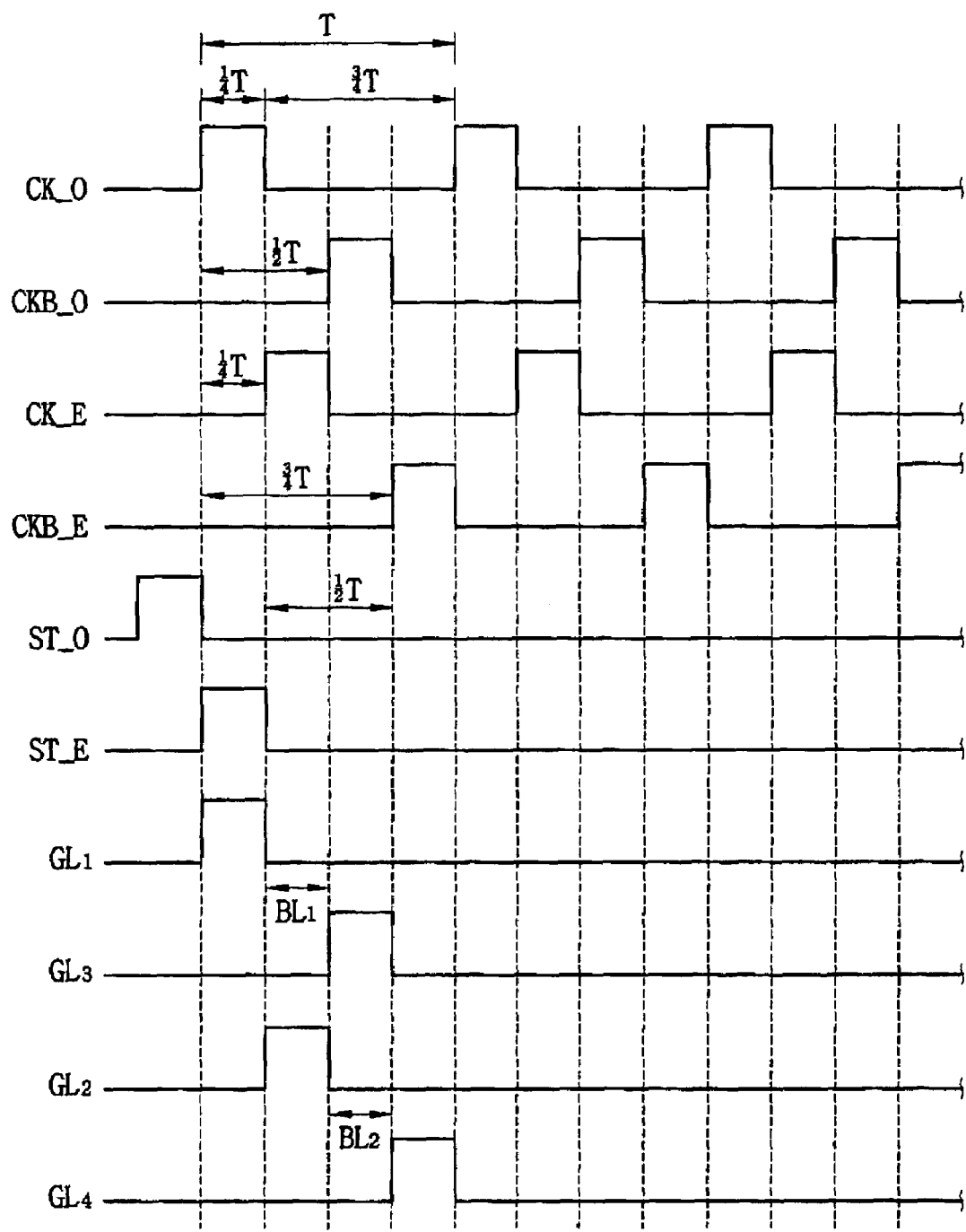
FIG. 10 is a timing diagram of the first and second gate driving circuits shown in FIGS. 8 and 9, according to an exemplary embodiment of the present invention.

FIG. 10 is a timing diagram of the first and second gate driving circuits shown in FIGS. 8 and 9. The first, second, third and fourth clock signals CK_O, CKB_O, CK_E and CKB_E each have a high state or a low state during a predetermined period T such that only one clock signal of a high state exists during a quarter period ¼T. Therefore, each of the first, second, third and fourth clock signals CK_O, CKB_O, CK_E and CKB_E has a high state during a first quarter period ¼T and a low state during the last periods, that is, three quarter period ¾T. In order to that only one clock signal has a high state during one quarter period ¼T, the second to third clock signals CKB_O, CK_E and CKB_E are delayed with respect to the first clock signal CK_O. Particularly, the second clock signal CKB_O is delayed by a half period ½T with respect to the first clock signal CK_O, the third clock signal CK_E is delayed by a quarter period ¼T with respect to the first clock signal CK_O, and the fourth clock signal CKB_E is delayed by a three quarter period ¾T with respect to the first clock signal CK_O.

In response to the transition of a first start signal ST_O from a high state to a low state, a first odd stage $SRC\_O_1$ outputs the first clock signal CK_O of a high state as a first gate driving signal, which is applied to a first gate line $GL_1$. The second start signal ST_E is delayed by a quarter period ¼T with respect to the first start signal ST_O, but is ahead by a quarter period ¼T with respect to the third clock signal CK_E. When the second start signal ST_E is transitioned from a high state to a low state, a first even stage $SRC\_E_1$ outputs the third clock signal CK_E of a high state as a second gate driving signal, which is applied to a second gate line $GL_2$. Thus, the second gate driving signal is applied to the even-numbered gate line $GL_2$, after the first gate driving signal applied to the odd-numbered gate line $GL_1$ is transitioned from a high state to a low state.

When the second clock signal CKB_O of a high state is applied to the first gate driving circuit 350 in response to the transition of the first clock signal CK_O from a high state to a low state, a second odd stage $SRC\_O_2$ outputs the second clock signal CKB_O of a high state as the first gate driving signal in response to the first stage driving signal output from the first odd stage $SRC\_O_1$. The first gate driving signal output from the second odd stage $SRC\_O_2$ is applied to a third gate line $GL_3$. Since the second odd stage $SRC\_O_2$ outputs the first gate driving signal after the first gate driving signal output from the first odd stage $SRC\_O_1$ is transitioned from a high state to a low sate, a first blank interval $BL_1$ exists after the first odd stage $SRC\_O_1$ outputs the first gate driving signal of a high state and before the second odd stage $SRC\_O_2$ outputs the first gate driving signal of a high state.

When the fourth clock signal CKB_E of a high state is applied to a second even stage $SRC\_E_2$ after the third clock signal CK_E is transitioned from a high state to a low state, the second even stage $SRC\_E_2$ outputs the fourth clock signal CKB_E of a high state as the second gate driving signal in response to the second stage driving signal output from the first even stage $SRC\_E_1$. The second gate driving signal output from the second even stage $SRC\_E_2$ is applied to the fourth gate line $GL_4$. Since the second even stage $SRC\_E_2$ outputs the second gate driving signal after the first gate driving signal output from the second odd stage $SRC\_O_2$ is transitioned from a high state to a low sate, a second blank interval $BL_2$ exists after the first even stage $SRC\_E_1$ outputs the second gate driving signal having a high state and before the second even stage $SRC\_E_2$ outputs the second gate driving signal having a high state. Thus, the N number of odd stages $SRC\_O_1$ to $SRC\_O_n$ and the N number of even stages $SRC\_E_1$ to $SRC\_E_n$ are alternately activated to output the first and second gate driving signals, which are alternatively applied to the gate lines $GL_1$ to $GL_{2n}$.

Figure 11:
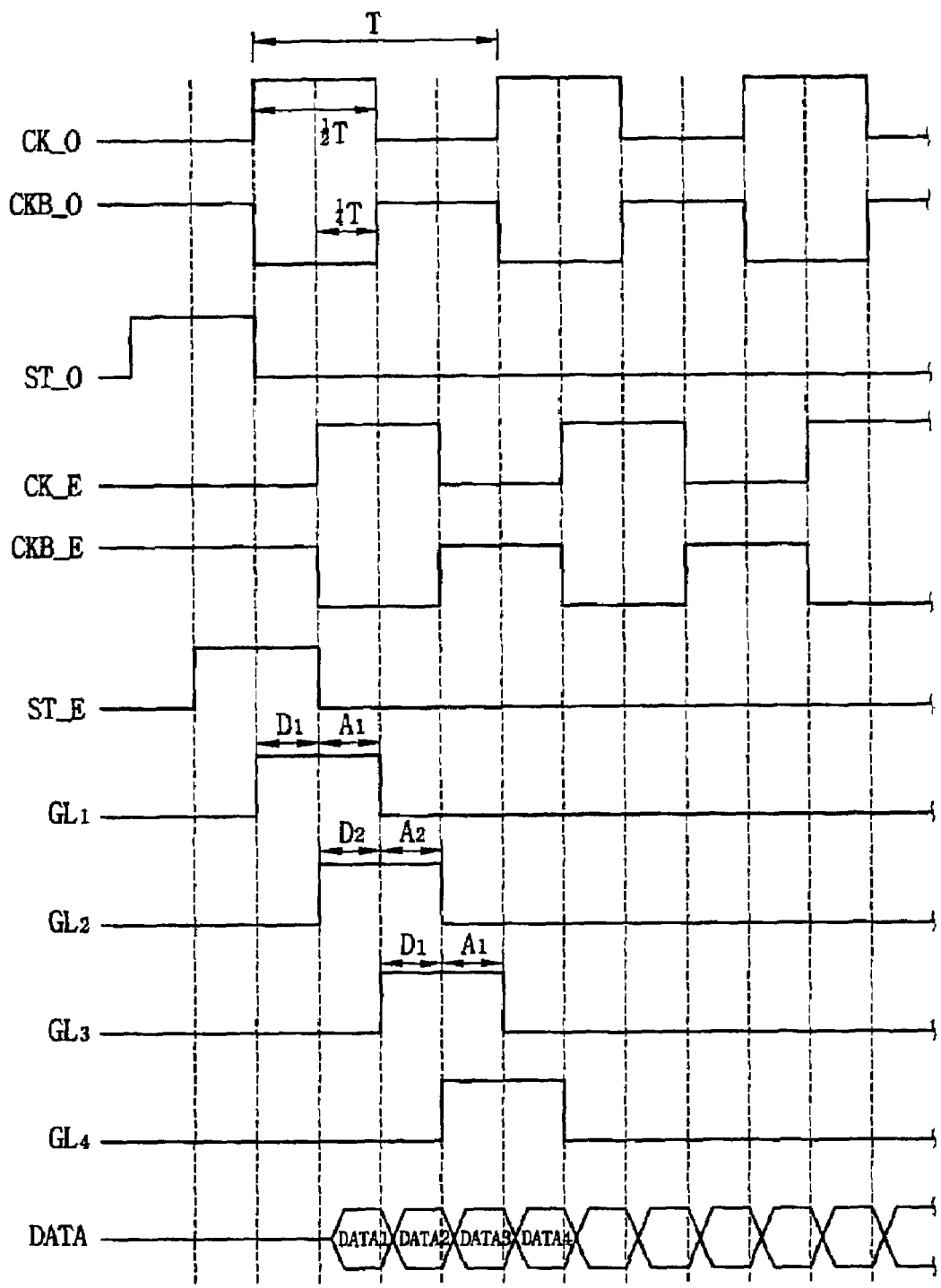
FIG. 11 is a timing diagram of the first and second gate driving circuits shown in FIGS. 8 and 9, according to another exemplary embodiment of the present invention.

FIG. 11 is a timing diagram of the first and second gate driving circuits according to another exemplary embodiment of the present invention. The first to fourth clock signals CK_O, CKB_O, CK_E and CKB_E each have a high state or a low state during a predetermined period T. For example, the clock signals each have a high state during a first half period ½T and a low state during the last half period ½T. The second clock signal CKB_O is delayed by a half period ½T with respect to the first clock signal CK_O, and thus the first and second clock signals CK_O and CKB_O have the opposite phase to each other during the predetermined period T. The third clock signal CK_E is delayed by a quarter period ¼T with respect to the first clock signal CK_O and the fourth clock signal CKB_E is delayed by a half period ½T with regard to the third clock signal CK_E. Thus, the third and fourth clock signals CK_E and CKB_E have the opposite phase to each other during the predetermined period T.

A first start signal ST_O has a high state during a half period ½T and is transitioned from a high state to a low state before the first clock signal CK_O of a high state is applied to a first odd stage $SRC\_O_1$. The first odd stage $SRC\_O_1$ outputs the first clock signal CK_O having a high state as a first gate driving signal, which is applied to a first gate line $GL_1$. When the second clock signal CKB_O is applied to a second odd stage $SRC\_O_2$ after the first clock signal CK_O is transitioned from a high state to a low state, the second odd stage $SRC\_O_2$ outputs the second clock signal CKB_O of the high state as the first gate driving signal, in response to the first stage driving signal output from the first odd stage $SRC\_O_1$, which is applied to a third gate line $GL_3$.

A second start signal ST_E is delayed by a quarter period ¼T with the first start signal ST_O and has a high state during a half period ½T. When the second start signal ST_E is transitioned from a high state to a low state, a first even stage $SRC\_E_1$ outputs the third clock signal CK_E of a high state as a second gate driving signal, which is applied to a second gate line $GL_2$. When the fourth clock signal CKB_E of a high state is applied to a second even stage $SRC\_E_2$ after the third clock signal CK_E is transitioned from a high state to a low state, the second even stage $SRC\_E_2$ outputs the fourth clock signal CKB_E of a high state as the second gate driving signal in response to a second stage driving signal output from the first even stage $SRC\_E_1$. The second gate driving signal output from the second even stage $SRC\_E_2$ is applied to a fourth gate line $GL_4$.

As shown in FIG. 11, the first gate driving signal output from the first or second odd stage $SRC\_O_1$ or $SRC\_O_2$ has a first dummy interval $D_1$ during a quarter period ¼T and a first active interval $A_1$ following the first dummy interval $D_1$ during a quarter period ¼T. The second gate driving signal output from the first or second even stage $SRC\_E_1$ or $SRC\_E_2$ has also a second dummy interval $D_2$ during a quarter period ¼T and a second active interval $A_2$ following the second dummy interval $D_2$ during a quarter period ¼T. Since the second gate driving signal applied to the second gate line $GL_2$ is delayed by a quarter period ¼T with respect to the first gate driving signal applied to the first gate line $GL_1$, the active interval $A_1$ of the first gate driving signal applied to the first gate line $GL_1$ is overlapped with the dummy interval $D_2$ of the second gate driving signal applied to the second gate line $GL_2$. Further, the first gate driving signal applied to the third gate line $GL_3$ is delayed by a quarter period ¼T with respect to the second driving signal applied to the second gate line $GL_2$, and thus, the active interval $A_2$ of the second gate driving signal applied to the second gate line $GL_2$ is overlapped with the dummy interval $D_1$ of the first gate driving signal applied to the third gate line $GL_3$.

The driving chip 370 outputs a data driving signal during the first or second active period $A_1$ or $A_2$. For example, the driving chip 370 outputs a first data driving signal DATA1 at the first active interval $A_1$ of the first gate driving signal applied to the first gate line $GL_1$ and outputs a second data driving signal DATA2 at the second active interval $A_2$ of the second gate driving signal applied to the second gate line $GL_2$. Thus, the gate lines $GL_1$ to $GL_{2n}$ alternately receive the first and second gate driving signals.

Since the first gate driving circuit 350 outputting the first gate driving signal to the odd gate lines and the second gate driving circuit 360 outputting the second gate driving signal to the even gate lines are independently operated, the first and second gate driving circuits 350 and 360 are not subordinately connected to each other. Thus, the LCD apparatus 800 prevents the first and second gate driving signals from distorting due to a line resistance of the gate lines. Therefore, the LCD apparatus 800 improves its operational properties. Further, since the first and second gate driving circuits 350 and 360 are disposed on the LCD panel such that the LCD panel has a symmetric structure and the LCD panel is formed with a single chip, the LCD apparatus 800 has a reduced BM width and improved display property.

Figure 12:
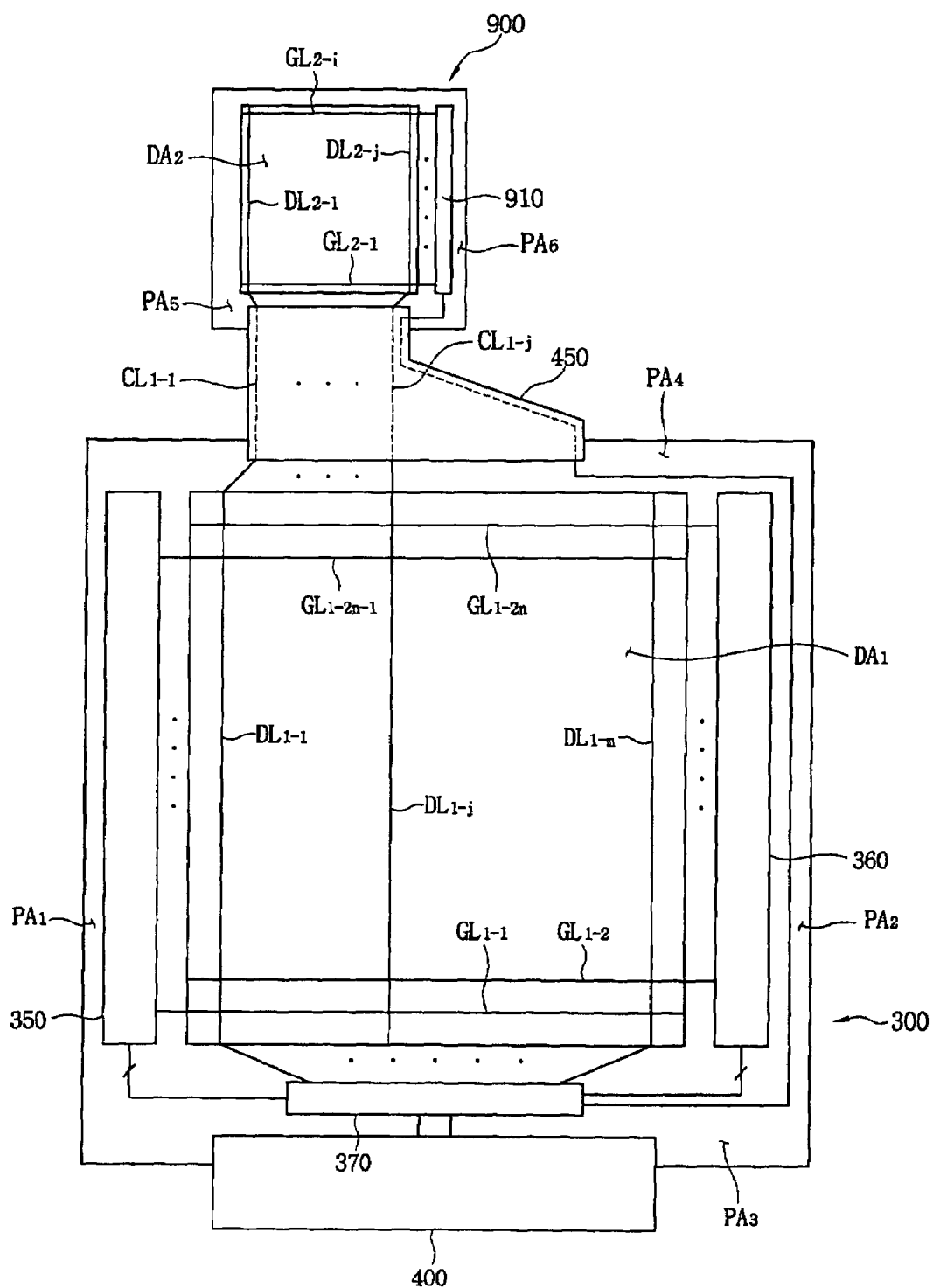
FIG. 12 is a schematic plan view showing an LCD apparatus with dual display screen according to further exemplary embodiment of the present invention.

FIG. 12 is a plan view showing an LCD apparatus with dual display screen according to further exemplary embodiment of the present invention. The same reference numerals are used to refer the same or like parts those described in FIG. 1 and any further explanation is omitted. An LCD apparatus with a dual display screen 1000 includes a first LCD panel 300, a second LCD panel 900, a driving chip 370, a first FPC 400 and a second FPC 450.

The first LCD panel 300 includes a first display area $DA_1$ for displaying a first image and first, second, third and fourth peripheral areas $PA_1$, $PA_2$, $PA_3$ and $PA_4$ surrounding the first display area $DA_1$. The first LCD panel 300 includes a 2N number of first gate lines $GL_{1-1}$ to $GL_{1-2n}$ and an M number of first data lines $DL_{1-1}$ to $DL_{1-m}$ substantially perpendicular to the first gate lines $GL_{1-1}$ to $GL_{1-2n}$, at the first display area $DA_1$.

A first gate driving circuit 350 is formed on the first peripheral area $PA_1$ and a second gate driving circuit 360 is formed on the second peripheral area $PA_2$. The first gate driving circuit 350 outputs first gate driving signals to odd-numbered gate lines of the first gate lines $GL_{1-1}$ to $GL_{1-2n-1}$, and the second gate driving circuit 360 outputs second gate driving signals to even-numbered gate lines of the first gate lines $GL_{1-2}$ to $GL_{1-2n}$.

The driving chip 370 is mounted on the third peripheral area $PA_3$, to which the first FPC 400 is attached. The first FPC 400 is electrically connected to the driving chip 370 to apply external signals to the driving chip 370. The driving chip 370 outputs the first data signal to the first data lines $DL_{1-1}$ to $DL_{1-m}$, and outputs first and second gate control signals to the first and second gate driving circuits 350 and 360, respectively. In response to the first and second gate control signals, the first and second gate driving circuits 350 and 360 output first and second gate driving signals to the first gate lines $GL_{1-1}$ to $GL_{1-2n}$.

The second LCD panel 900 includes a second display area $DA_2$ for displaying a second image, and fifth and sixth peripheral areas $PA_5$ and $PA_6$ adjacent to the second display area $DA_2$. On the sixth peripheral area $PA_6$, a third gate driving circuit 910 is formed. The second LCD panel 900 includes a I number of second gate lines $GL_{2-1}$ to $GL_{2-i}$ and a J number of second data line $DL_{2-1}$ to $DL_{2-j}$ substantially perpendicular to the second gate lines $GL_{2-1}$ to $GL_{2-i}$, at the second display area $DA_2$. The driving chip 370 outputs the second data signal to the second LCD panel 900 and a third gate control signal to the third gate driving circuit 910. The third gate driving circuit 910 sequentially outputs a third gate driving signal to the second gate lines $GL_{2-1}$ to $GL_{2-i}$ in response to the third gate control signal. The data signal is applied to second data lines $DL_{2-1}$ to $DL_{2-j}$, and the third gate driving signal is applied to the second gate lines $GL_{2-1}$ to $GL_{2-i}$. The "I" and "N" are an integer identical to or greater than two, and the "I" is equal to or less than the "N". Also, the "J" and "M" are an integer identical to or greater than two, and the "J" is equal to or less than the "M".

The first and second LCD panels 300 and 900 are electrically connected to each other by means of the second FPC 450. The second FPC 450 includes a first end portion attached to the fourth peripheral area $PA_4$ of the first LCD panel 300 and a second end portion attached to the fifth peripheral area $PA_5$ of the second LCD panel 900. Thus, although the first driving chip 400 is mounted onto the first peripheral area $PA_1$, the driving chip 370 is electrically connected to the second LCD panel 900 by means of the second FPC 450. One end of the first data lines $DL_{1-1}$ to $DL_{1-i}$ is electrically connected to the second data line $DL_{2-1}$ to $DL_{2-j}$ via a connection line $CL_{1-1}$ to $CL_{1-j}$ formed at the second FPC 450. Thus, the second data signal output from the driving chip 370 is applied to the second data line $DL_{2-1}$ to $DL_{2-j}$ via the connection line $CL_{1-1}$ to $CL_{1-j}$.

Although FIG. 12 shows an LCD apparatus in which two gate driving circuits 350 and 360 are connected to the first LCD panel 300, the LCD apparatus may include one gate driving circuit to output gate driving signals to the first gate lines of the first LCD panel 300.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A gate driving device for applying gate driving signals to gate lines of a liquid crystal display panel, comprising a plurality of stages connected to one another in parallel to apply gate driving signals to gate lines of a liquid crystal display panel, wherein:
  a last stage of the stages includes a last control terminal which receives a start signal, and
  odd-numbered stages of the stages each output the gate driving signals to odd-numbered gate lines of the gate lines in response to a first clock signal, and even-numbered stages of the stages each output the gate driving signals to even-numbered gate lines of the gate lines in response to a second clock signal, the second clock having an opposite phase from a phase of the first clock signal.

2. The gate driving device according to claim 1, wherein the first and second clock signals each have a high stage during a first half period and a last half period, respectively, and the first and second clock signals each have a low state during the last half period and the first half period, respectively.

3. The gate driving device according to claim 1, wherein each of the stages includes:
  a clock signal terminal to receive the first or second clock signal;
  a first output terminal to output the gate driving signals in response to the first or second clock signal;
  a second output terminal to output a stage driving signal in response to the first or second clock signal;
  an input terminal to receive the stage driving signal from a previous stage; and
  a control terminal to receive the stage driving signal from a next stage.

4. The gate driving device according to claim 3, wherein the input terminal of a first stage of the stages receives the start signal.

5. The gate driving device according to claim 3, wherein each of the stages further includes:
  a ground voltage terminal to receive a ground voltage; and
  a driving voltage terminal to receive a driving voltage.

6. The gate driving device according to claim 3, wherein each of the stages further includes:
  a first pull-up part to output the first or second clock signal to the first output terminal;
  a second pull-up part to output the first or second clock signal to the second output terminal;
  a first pull-down part to discharge the first or second clock signal in response to an inactivation of the first pull-up part;
  a second pull-down part to discharge the first or second clock signal in response to an inactivation of the second pull-up part;
  a pull-up driving part to activate the first and second pull-up parts; and
  a pull-down driving part to activate the first and second pull-down parts while inactivating the first and second pull-up parts.

7. The gate driving device according to claim 6,
  wherein the first pull-up part includes a first NMOS transistor having a source electrode connected to the clock signal terminal, a drain electrode connected to the first output terminal and a gate electrode connected to the pull-up driving part; and
  wherein the second pull-up part includes a second NMOS transistor having a source electrode connected to the clock signal terminal, a drain electrode connected to the second output terminal and a gate electrode connected to the gate electrode of the first pull-up part.

8. The gate driving device according to claim 6,
  wherein the first pull-down part includes a third NMOS transistor having a source electrode connected to a ground voltage terminal, a drain electrode connected to the first output terminal and a gate electrode connected to the pull-down driving part; and
  wherein the second pull-down part includes a fourth NMOS transistor having a source electrode connected to the ground voltage terminal, a drain electrode connected to the second output terminal and a gate electrode connected to the gate electrode of the third NMOS transistor.

9. The gate driving device according to claim 6, wherein the pull-up driving part includes:
  a fifth NMOS transistor having a drain electrode connected to a driving voltage terminal, a source electrode connected to the pull-down driving part and a gate electrode connected to the input terminal;
  a sixth NMOS transistor having a drain electrode connected to the driving voltage terminal, a source electrode connected to a drain electrode of a seventh NMOS transistor and a gate electrode connected to the driving voltage terminal; and
  the seventh NMOS transistor having a source electrode connected to a ground voltage terminal, a drain electrode connected to the source electrode of the sixth NMOS transistor and a gate electrode connected to the first pull-up part.

10. The gate driving device according to claim 9, wherein the pull-down driving part includes:
  an eighth NMOS transistor having a drain electrode connected to a driving voltage terminal, a source electrode connected to the first pull-down part and a gate electrode connected to the source electrode of the sixth NMOS transistor;

a ninth NMOS transistor having a source electrode connected to the ground voltage terminal, a drain electrode connected to the first pull-down part and a gate electrode connected to the first pull-up part;

a tenth NMOS transistor having a source electrode connected to the ground voltage terminal, a drain electrode connected to the first pull-up part and a gate electrode connected to the first pull down part; and a eleventh NMOS transistor having a source electrode connected to the ground voltage terminal, a drain electrode connected to the first pull-up part and a gate electrode connected to the control terminal.

11. The gate driving device according to claim 10, wherein the pull-down driving part further includes a twelfth NMOS transistor having a source electrode connected to the ground voltage terminal, a drain electrode connected to the first pull-down part and a gate electrode connected to the input terminal.

12. A liquid crystal display apparatus, comprising:
a liquid crystal display panel including a plurality of pixels, the pixels having a plurality of gate lines, a plurality of data lines and a plurality of switching elements connected between the gate lines and the data lines;
a gate driving circuit disposed on the liquid crystal display panel and including a plurality of stages connected to one another in parallel, wherein the input terminal of a first stage of the stages receives a start signal, and the control terminal of a last stage of the stages receives the start signal; and odd-numbered stages of the stages each apply gate driving signals to odd-numbered gate lines of the gate lines, in response to a first clock signal; and even-numbered stages of the stages each apply the gate driving signals to even-numbered gate lines of the gate lines, in response to a second clock signal having an opposite phase from a phase of the first clock signal; and
a data driving chip, disposed on the liquid crystal display panel, to apply data driving signals to the data lines.

13. The liquid crystal display apparatus according to claim 12, wherein the gate driving circuit includes:
a clock signal terminal to receive the first or second clock signal;
a first output terminal to output the gate driving signals in response to the first or second clock signal;
a second output terminal to output a stage driving signal in response to the first or second clock signal;
an input terminal to receive the stage driving signal from a previous stage; and
a control terminal to receive the stage driving signal from a next stage.

14. The liquid crystal display apparatus according to claim 12, wherein each of the stages further includes:
a ground voltage terminal to receive a ground voltage; and
a driving voltage terminal to receive a driving voltage.

15. The liquid crystal display apparatus according to claim 14, wherein the data driving chip provides the start signal, the ground voltage, the driving voltage and the first or second clock signal to the gate driving circuit.

16. The liquid crystal display apparatus according to claim 15, further comprising:
a flexible printed board electrically connected to the data driving chip to output the start signal, the ground voltage, the driving voltage, the first or second clock signal and a data signal to the data driving chip.

17. A liquid crystal display apparatus, comprising:
a liquid crystal display panel including a plurality of gate lines and a plurality of data lines;
a first gate driving circuit including a plurality of first stages connected to one another in parallel and disposed on the liquid crystal display panel, the first stages outputting first gate driving signals to odd-numbered gate lines of the gate lines with a blank period, wherein a last stage of the first stages includes a last control terminal which receives a first start signal;
a second gate driving circuit including a plurality of second stages connected to one another in parallel and disposed on the liquid crystal display panel, the second stages outputting second gate driving signals to even-numbered gate lines of the gate lines during the blank period; and
a data driving chip, disposed on the liquid crystal display panel, to output data driving signals to the data lines.

18. The liquid crystal display apparatus according to claim 17, wherein each of the first stage includes:
a clock signal terminal to receive a first clock signal or a second clock signal having a different phase from a phase of the first clock signal;
a first output terminal to output the first gate driving signals in response to the first or second clock signal;
a second output terminal to output a first stage driving signal in response to the first or second clock signal;
an input terminal to receive the first stage driving signal from a previous first stage; and
a control terminal to receive the first stage driving signal from a next first stage.

19. The liquid crystal display apparatus according to claim 18, wherein:
the first clock signal is at a high state during a first quarter period of a full period and is at a low state during a second quarter period, a third quarter period and a fourth quarter period of the full period, and
the second clock signal is at a high state during the third quarter period of the full period and is at a low state during the first quarter period, the second quarter period and the fourth quarter period of the full period.

20. The liquid crystal display apparatus according to claim 19, wherein the first clock signal is applied to the clock signal terminal of odd-numbered stages of the first stages, and the second clock signal is applied to the clock signal terminal of even-numbered stages of the first stages.

21. The liquid crystal display apparatus according to claim 20, wherein each of the second stages includes:
a clock signal terminal output to receive a third clock signal or a fourth clock signal having an opposite phase from a phase of the third clock signal;
a first output terminal to output the second gate driving signals in response to the third or fourth clock signal;
a second output terminal to output a second stage driving signal in response to the third or fourth clock signal;
an input terminal to receive the second stage driving signal from a previous second stage; and
a control terminal to receive the second stage driving signal from a next second stage.

22. The liquid crystal display apparatus according to claim 21, wherein:
the third clock signal is at a high state during the second quarter period of the full period and is at a low state during the first quarter period, the third quarter period and the fourth quarter period of the full period, and
the fourth clock signal is at a high state during the fourth quarter period of the full period arid is at a low state during the first quarter period, the second quarter period and the third quarter period of the full period.

23. The liquid crystal display apparatus according to claim 22, wherein the third clock signal is applied to the clock signal terminal of odd-numbered stages of the second stages, and the fourth clock signal is applied to the clock signal terminal of even-numbered stages of the second stages.

24. The liquid crystal display apparatus according to claim 17, wherein each of the second stages outputs the second gate driving signals delayed by a quarter period with respect to the first gate driving signals output from a corresponding one of the first stages.

25. The liquid crystal display apparatus according to claim 17, wherein the data driving chip applies a first gate control signal to the first gate driving circuit and applies a second gate control signal to the second gate driving circuit, wherein the first gate control signal includes the first start signal and the second gate control signal includes a second start signal.

26. A liquid crystal display apparatus, comprising:
a liquid crystal display panel including a plurality of gate lines and a plurality of data lines;
a first gate driving circuit including a plurality of first stages connected to one another in parallel and disposed on the liquid crystal display panel, the first stages outputting first gate driving signals having a first dummy period and a first active period following the first dummy period to odd-numbered gate lines of the gate lines, wherein a last stage of the first stages includes a last control terminal which receives a first start signal;
a second gate driving circuit including a plurality of second stages connected to one another in parallel and disposed on the liquid crystal display panel, the second stages outputting second gate driving signals having a second dummy period and a second active period following the second dummy period to even-numbered gate lines of the gate lines; and
a data driving chip, disposed on the liquid crystal display panel, to output data driving signals to the data lines during the first and second active periods.

27. The liquid crystal display apparatus according to claim 26, wherein each of the first stages includes:
a clock signal terminal to receive a first clock signal or a second clock signal having an opposite phase from a phase of the first clock signal;
a first output terminal to output the first gate driving signals in response to the first or second clock signal;
a second output terminal to output a first stage driving signal in response to the first or second clock signal;
an input terminal to receive the first stage driving signal from a previous first stage; and
a control terminal to receive the first stage driving signal from a next first stage.

28. The liquid crystal display apparatus according to claim 27, wherein:
the first clock signal is at a high state during a first quarter period and a second quarter period of a full period, and is at a low state during a third quarter period and a fourth quarter period of the full period,
and the second clock signal is at a low state during the first quarter period and the second quarter period of a full period, and is at a high state during the third quarter period and the fourth quarter period of the full period.

29. The liquid crystal display apparatus according to claim 28, wherein the first clock signal is applied to the clock signal terminal of odd-numbered stages of the first stages, and the second clock signal is applied to the clock signal terminal of even-numbered stages of the first stages.

30. The liquid crystal display apparatus according to claim 28, wherein each of the second stage includes:
a clock signal terminal to receive a third clock signal or a fourth clock signal having an opposite phase from a phase of the third clock signal;
a first output terminal to output the second gate driving signals in response to the third or fourth clock signal;
a second output terminal to output a second stage driving signal in response to the third or fourth clock signal;
an input terminal to receive the second stage driving signal from a previous second stage; and
a control terminal to receive the second stage driving signal from a next second stage.

31. The liquid crystal display apparatus according to claim 30, wherein:
the third clock signal is at a high state during the second quarter period and the third quarter period of the full period, and is at a low state during the first quarter period and the fourth quarter period of the full period, and
the fourth clock signal is at a low state during the second quarter period and the third quarter period of the full period, and is at a high state during the first quarter period and the fourth quarter period of the full period.

32. The liquid crystal display apparatus according to claim 26, wherein the first active period of the first gate driving signals output from one of the first gate driving circuit is overlapped with the second dummy period of the second gate driving signals output from a corresponding one of the second gate driving circuit.

33. The liquid crystal display apparatus according to claim 26, wherein the gate driving chip applies a first gate control signal to the first gate driving circuit and applies a second gate control signal to the second gate driving circuit, wherein the first gate control signals include the first start signal and the second gate control signals include a second start signal.

* * * * *